(12) United States Patent
Shimizu et al.

(10) Patent No.: US 11,201,223 B2
(45) Date of Patent: Dec. 14, 2021

(54) SEMICONDUCTOR DEVICE, INVERTER CIRCUIT, DRIVE DEVICE, VEHICLE, AND ELEVATOR EACH HAVING A THRESHOLD-VOLTAGE-INCREASING PORTION IN SILICON CARBIDE LAYER

(71) Applicant: KABUSHIKI KAISHA TOSHIBA, Minato-ku (JP)

(72) Inventors: Tatsuo Shimizu, Shinagawa (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 73 days.

(21) Appl. No.: 16/789,535

(22) Filed: Feb. 13, 2020

(65) Prior Publication Data

US 2021/0066467 A1 Mar. 4, 2021

(30) Foreign Application Priority Data

Aug. 27, 2019 (JP) .............................. JP2019-155034

(51) Int. Cl.
*H01L 29/423* (2006.01)
*H01L 29/10* (2006.01)
*H01L 29/16* (2006.01)

(52) U.S. Cl.
CPC .... *H01L 29/42356* (2013.01); *H01L 29/1045* (2013.01); *H01L 29/1095* (2013.01); *H01L 29/1608* (2013.01)

(58) Field of Classification Search
CPC ........... H01L 29/42356; H01L 29/1045; H01L 29/1095; H01L 29/1608
See application file for complete search history.

(56) References Cited

U.S. PATENT DOCUMENTS 7,018,597 B2 3/2006 Ellison et al.
2013/0234161 A1* 9/2013 Shimizu ............ H01L 29/66068
257/77

(Continued)

FOREIGN PATENT DOCUMENTS

JP 2002-289550 A 10/2002
JP 2009-73734 A 4/2009

OTHER PUBLICATIONS

Noguchi, M. et al., "Channel engineering of 4H—SiC MOSFETs using sulphur as a deep level donor," Tech. Dig. Of IEEE, International Electron Devices Meeting (IEDM2018), 2018, pp. 185-188.

*Primary Examiner* — Michael Jung
(74) *Attorney, Agent, or Firm* — Oblon, McClelland, Maier & Neustadt, L.L.P.

(57) ABSTRACT

A semiconductor device according to an embodiment includes a gate electrode, a gate insulating layer, and a silicon carbide layer. The silicon carbide layer includes at least one first element selected from the group consisting of S, Se, Te, Ti, Zr, Hf, V, Nb, Ta, Cr, Mo, and W. The first distance between a first position and an interface between the gate insulating layer and the silicon carbide layer is equal to or less than 20 nm, and the first position is a position where a concentration of the first element is maximized. The second distance between a second position and the interface is equal to or less than 20 nm, second position is a position where a concentration of the first element is $\frac{1}{10}$ of a concentration of the first element at the first position, and the second position is farther from the interface than the first position.

16 Claims, 17 Drawing Sheets

(56) References Cited

U.S. PATENT DOCUMENTS

2014/0246682 A1\* 9/2014 Uchida ............... H01L 27/0629
                                                257/77
2021/0013308 A1\* 1/2021 Noguchi ............ H01L 29/4236

\* cited by examiner

S in Silicon site of SiC

S in Carbon site of SiC

SEMICONDUCTOR DEVICE, INVERTER CIRCUIT, DRIVE DEVICE, VEHICLE, AND ELEVATOR EACH HAVING A THRESHOLD-VOLTAGE-INCREASING PORTION IN SILICON CARBIDE LAYER

CROSS-REFERENCE TO RELATED APPLICATION

This application is based upon and claims the benefit of priority from Japanese Patent Application No. 2019-155034, filed on Aug. 27, 2019, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected as a material for next-generation semiconductor devices. As compared with silicon (Si), silicon carbide has superior physical properties such as an approximately threefold band gap, approximately tenfold breakdown field strength, and approximately threefold thermal conductivity. By using these characteristics, a semiconductor device in which low loss and a high-temperature operation can be realized.

A metal oxide semiconductor field effect transistor (MOSFET) using silicon carbide tends to have a lower threshold voltage and lower mobility than a MOSFET using silicon, for example. Therefore, a MOSFET capable of realizing a high threshold voltage and high mobility is desired.

DETAILED DESCRIPTION

Figure 1:
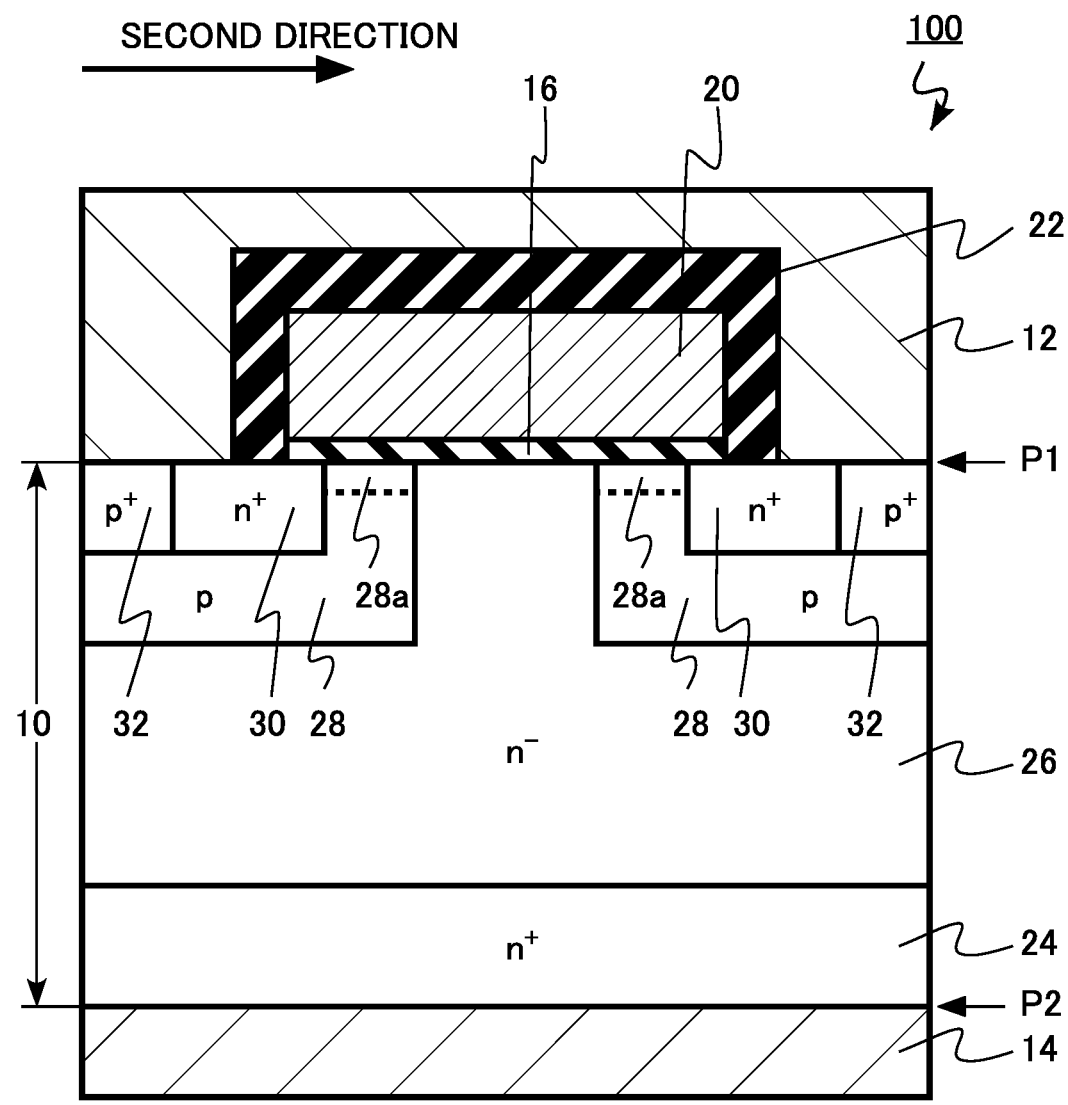
FIG. 1 is a schematic cross-sectional view of a semiconductor device according to a first embodiment.

A semiconductor device according to an embodiment includes a gate electrode; a gate insulating layer; and a silicon carbide layer. The gate insulating layer is located between the gate electrode and the silicon carbide layer, the silicon carbide layer includes at least one first element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W), a first distance between a first position in the silicon carbide layer and an interface between the gate insulating layer and the silicon carbide layer is equal to or less than 20 nm, and the first position is a position where a concentration of the at least one first element is maximized, and a second distance between a second position in the silicon carbide layer and the interface is equal to or less than 20 nm, second position is a position where a concentration of the at least one first element is $1/10$ of a concentration of the at least one first element at the first position, and the second position is farther from the interface than the first position.

Hereinafter, embodiments of the present disclosure will be described with reference to the drawings. In the following description, the same or similar members are denoted by the same reference numerals and the description of the members described once is appropriately omitted.

In addition, in the following description, notations $n^+$, $n^-$, $p^+$, p, and $p^-$ represent the relative magnitudes of impurity concentrations in respective conductive types. That is, an n-type impurity concentration of $n^+$ is relatively higher than an n-type impurity concentration of n and an n-type impurity concentration of $n^-$ is relatively lower than the n-type impurity concentration of n. In addition, a p-type impurity concentration of is relatively higher than a p-type impurity concentration of p and a p-type impurity concentration of $p^-$ is relatively lower than the p-type impurity concentration of p. The type and the $n^-$ type may be simply described as the n types and the $p^+$ type and the $p^-$ type may be simply described as the p types. An impurity concentration of each region is represented by, for example, a value of an impurity concentration of a center portion of each region, unless otherwise specified.

The impurity concentration can be measured by secondary ion mass spectrometry (SIMS), for example. In addition, the relative magnitude of the impurity concentration can be determined from the magnitude of a carrier concentration obtained by scanning capacitance microscopy (SCM), for example. In addition, a distance such as a width and a depth of an impurity region can be obtained by SIMS, for example. In addition, the distance such as the width and the depth of the impurity region can be obtained from an SCM image, for example.

The depth of a trench, the thickness of an insulating layer, and the like can be measured on an SIMS or transmission electron microscope (TEM) image, for example.

First Embodiment

A semiconductor device according to a first embodiment includes a gate electrode, a gate insulating layer, and a silicon carbide layer having a first plane and a second plane facing the first plane. The gate insulating layer is located between the gate electrode and the silicon carbide layer. The silicon carbide layer includes at least one first element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W). A first distance between a first position in the silicon carbide layer and an interface between the gate insulating layer and the silicon carbide layer is equal to or less than 20 nm, and the first position is a position where a concentration of the at least one first element is maximized. A second distance between a second position in the silicon carbide layer and the interface is equal to or less than 20 nm, second position is a position where a concentration of the at least one first element is $\frac{1}{10}$ of a concentration of the at least one first element at the first position, and the second position is farther from the interface than the first position.

FIG. 1 is a schematic cross-sectional view of the semiconductor device according to the first embodiment. The semiconductor device according to the first embodiment is a vertical MOSFET 100. The MOSFET 100 is an n-channel transistor using electrons as carriers.

Figure 2:
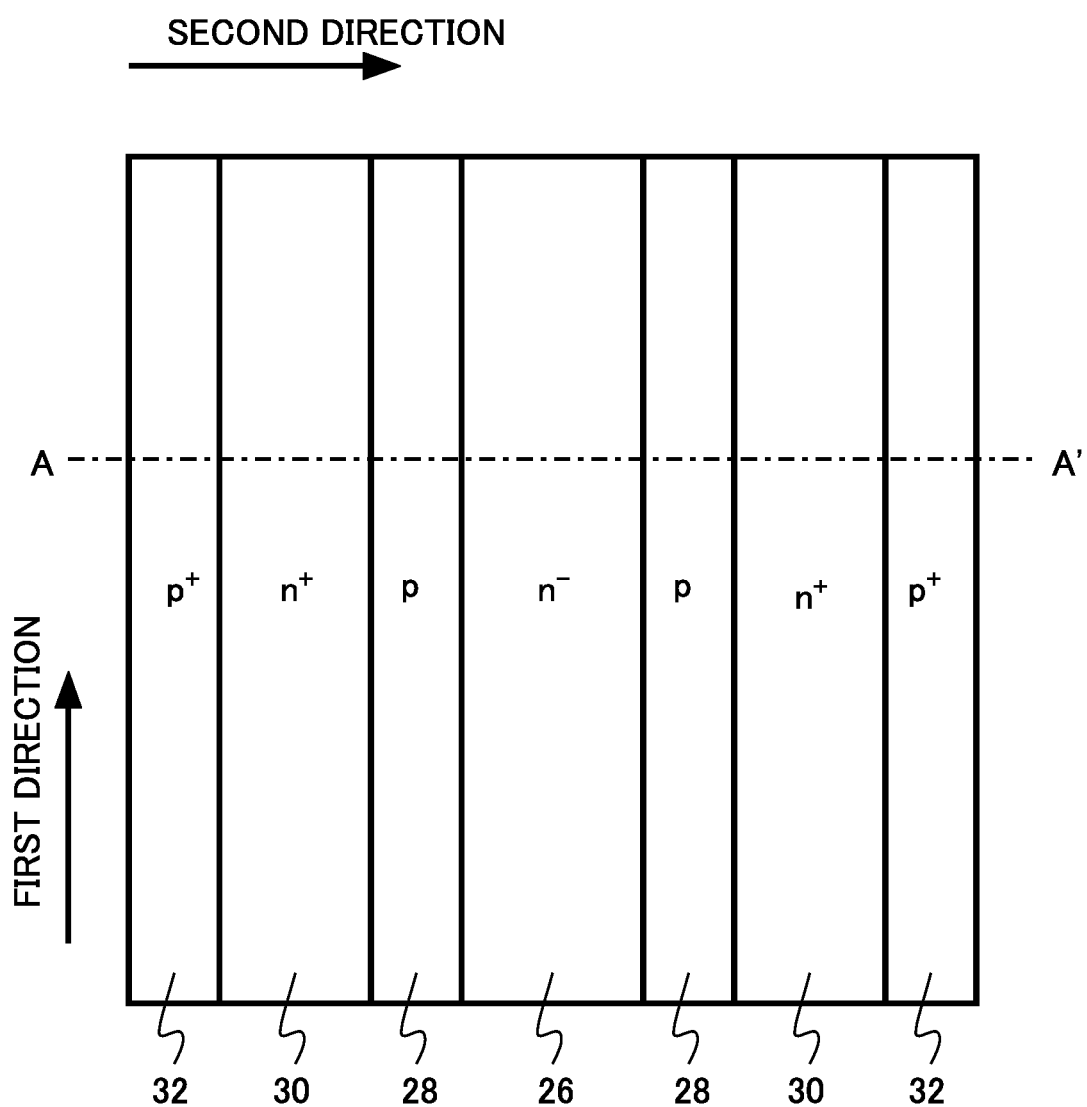
FIG. 2 is a schematic top view of the semiconductor device according to the first embodiment.

FIG. 2 is a schematic top view of the semiconductor device according to the first embodiment. FIG. 2 is a view showing a first plane of a silicon carbide layer 10. FIG. 1 is a cross-sectional view taken along the line AA' of FIG. 2.

The MOSFET 100 includes a silicon carbide layer 10, a source electrode 12 (first electrode), a drain electrode (second electrode), a gate insulating layer 16, a gate electrode 20, and an interlayer insulating layer 22.

In the silicon carbide layer 10, a drain region 24, a drift region 26, a p-well region 28, a source region 30, and a p-well contact region 32 exist. The p-well region 28 has an additive element portion 28a.

Figure 3:
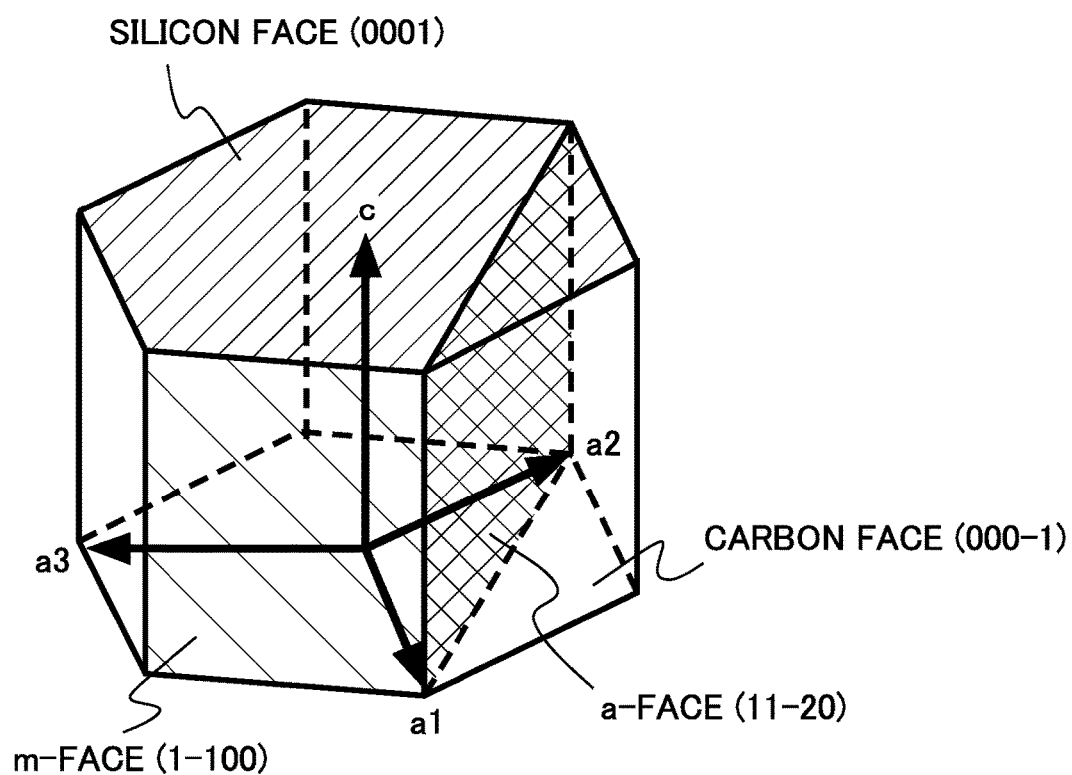
FIG. 3 is a diagram showing a crystal structure of an SiC semiconductor.

FIG. 3 is a diagram showing a crystal structure of an SiC semiconductor. A typical crystal structure of the SiC semiconductor is a hexagonal crystal system such as 4H—SiC.

In the SiC semiconductor of the hexagonal crystal system, one of faces (top faces of a hexagonal column) with a c-axis along an axial direction of the hexagonal column as a normal is a (0001) face. The (0001) face is referred to as a silicon face. Silicon atoms (Si) are arranged on an outermost face of the silicon face.

The other of the faces (top faces of the hexagonal column) with the c-axis along the axial direction of the hexagonal column as the normal is a (000-1) face. The (000-1) face is referred to as a carbon face. Carbon atoms (C) are arranged on an outermost face of the carbon face.

A side face (column face) of the hexagonal column is an m-face to be a face equivalent to a (1-100) face, that is, a {1-100} face. Further, a face passing through a pair of ridge lines not adjacent to each other is an a-face to be a face equivalent to a (11-20) face, that is, a {11-20} face. Both silicon atoms (Si) and carbon atoms (C) are arranged on outermost faces of the m-face and the a-face.

The silicon carbide layer 10 is, for example, single crystal of 4H—SiC. The silicon carbide layer 10 has a first plane P1 and a second plane P2. The second plane P2 faces the first plane P1. The first plane P1 is a face of the silicon carbide layer 10, and the second plane P2 is a back face of the silicon carbide layer 10.

In the present specification, the "depth" means a depth based on the first plane.

Hereinafter, a case where the first plane P1 of the silicon carbide layer 10 is a face inclined by equal to or more than 0 degrees and equal to or less than 10 degrees with respect to the silicon face and the second plane P2 is a face inclined by equal to or more than 0 degrees and equal to or less than 10 degrees with respect to the carbon face will be described as an example. The first plane P1 of the silicon carbide layer 10 has an off angle of equal to or more than 0 degrees and equal to or less than 10 degrees with respect to the silicon face.

Characteristics of the face inclined by equal to or more than 0 degrees and equal to or less than 10 degrees with respect to the silicon face can be regarded as being approximately the same as those of the silicon face. Further, characteristics of the face inclined by equal to or more than 0 degrees and equal to or less than 10 degrees with respect to the carbon face can be regarded as being approximately the same as those of the carbon face.

The drain region 24 is n$^+$-type SiC. The drain region 24 includes nitrogen (N) as n-type impurities, for example. An n-type impurity concentration of the drain region 24 is, for example, equal to or more than $1 \times 10^{18}$ cm$^{-3}$ and equal to or less than $1 \times 10^{21}$ cm$^{-3}$.

The drift region 26 is n$^-$-type SiC. The drift region 26 is located between the drain region 24 and the first plane P1. A part of the drift region 26 is in contact with the first plane P1.

The drift region 26 includes nitrogen (N) as n-type impurities, for example. An n-type impurity concentration of the drift region 26 is, for example, equal to or more than $1 \times 10^{15}$ cm$^{-3}$ and equal to or less than $2 \times 10^{16}$ cm$^{-3}$. An n-type impurity concentration of the drift region 26 is lower than the n-type impurity concentration of the drain region 24.

The drift region 26 is, for example, an SiC epitaxial growth layer formed on the drain region 24 by epitaxial growth. The thickness of the drift region 26 is, for example, equal to or more than 5 μm and equal to or less than 100 μm.

The p-well region 28 is p-type SiC. The p-well region 28 is located between the drift region 26 and the first plane P1. A part of the p-well region 28 is in contact with the first plane P1. The p-well region 28 extends in the first direction.

The p-well region 28 includes aluminum (Al) as p-type impurities, for example. A p-type impurity concentration of the p-well region 28 is, for example, equal to or more than $1 \times 10^{16}$ cm$^{-3}$ and equal to or less than $1 \times 10^{20}$ cm$^{-3}$.

The depth of the p-well region 28 is, for example, equal to or more than 0.4 μm and equal to or less than 0.8 μm. The p-well region 28 functions as a channel region of the MOSFET 100.

The source region 30 is n$^+$-type SiC. The source region 30 is located between the p-well region 28 and the first plane P1. A part of the source region 30 is in contact with the first plane P1. The source region 30 extends in the first direction.

The source region 30 includes phosphorus (P) as n-type impurities, for example. An n-type impurity concentration of the source region 30 is, for example, equal to or more than $1\times10^{18}$ cm$^{-3}$ and equal to or less than $1\times10^{22}$ cm$^{-3}$. An n-type impurity concentration of the source region 30 is higher than the n-type impurity concentration of the drift region 26.

The depth of the source region 30 is shallower than the depth of the p-well region 28. The depth of the source region 30 is, for example, equal to or more than 0.2 μm and equal to or less than 0.4 μm.

The p-well contact region 32 is p$^+$-type SiC. The p-well contact region 32 is located between the p-well region 28 and the first plane P1. A part of the p-well contact region 32 is in contact with the first plane P1. The p-well contact region 32 is adjacent to the source region 30. The p-well contact region 32 extends in the first direction.

The p-well contact region 32 includes aluminum as p-type impurities, for example. A p-type impurity concentration of the p-well contact region 32 is, for example, equal to or more than $1\times10^{18}$ cm$^{-3}$ and equal to or less than $1\times10^{22}$ cm$^{-3}$. The p-type impurity concentration of the p-well contact region 32 is higher than the p-type impurity concentration of the p-well region 28.

The depth of the p-well contact region 32 is shallower than the depth of the p-well region 28. The depth of the p-well contact region 32 is, for example, equal to or more than 0.2 μm and equal to or less than 0.4 μm.

The gate insulating layer 16 is located between the silicon carbide layer 10 and the gate electrode 20. The gate insulating layer 16 is located between the p-well region 28 and the gate electrode 20.

The gate insulating layer 16 is, for example, an oxide or an oxynitride. The gate insulating layer 16 is, for example, silicon oxide. The thickness of the gate insulating layer 16 is, for example, equal to or more than 30 nm and equal to or less than 20 nm.

The gate insulating layer 16 and the p-well region 28 are in contact with each other. The p-well region 28 in the vicinity of the gate insulating layer 16 becomes the channel region of the MOSFET 100.

The p-well region 28 has the additive element portion 28a in the vicinity of a portion in contact with the gate insulating layer 16. The additive element portion 28a includes at least one additive element (first element) selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W). Hereinafter, a case where the additive element is sulfur (S) will be described as an example.

Figure 4:
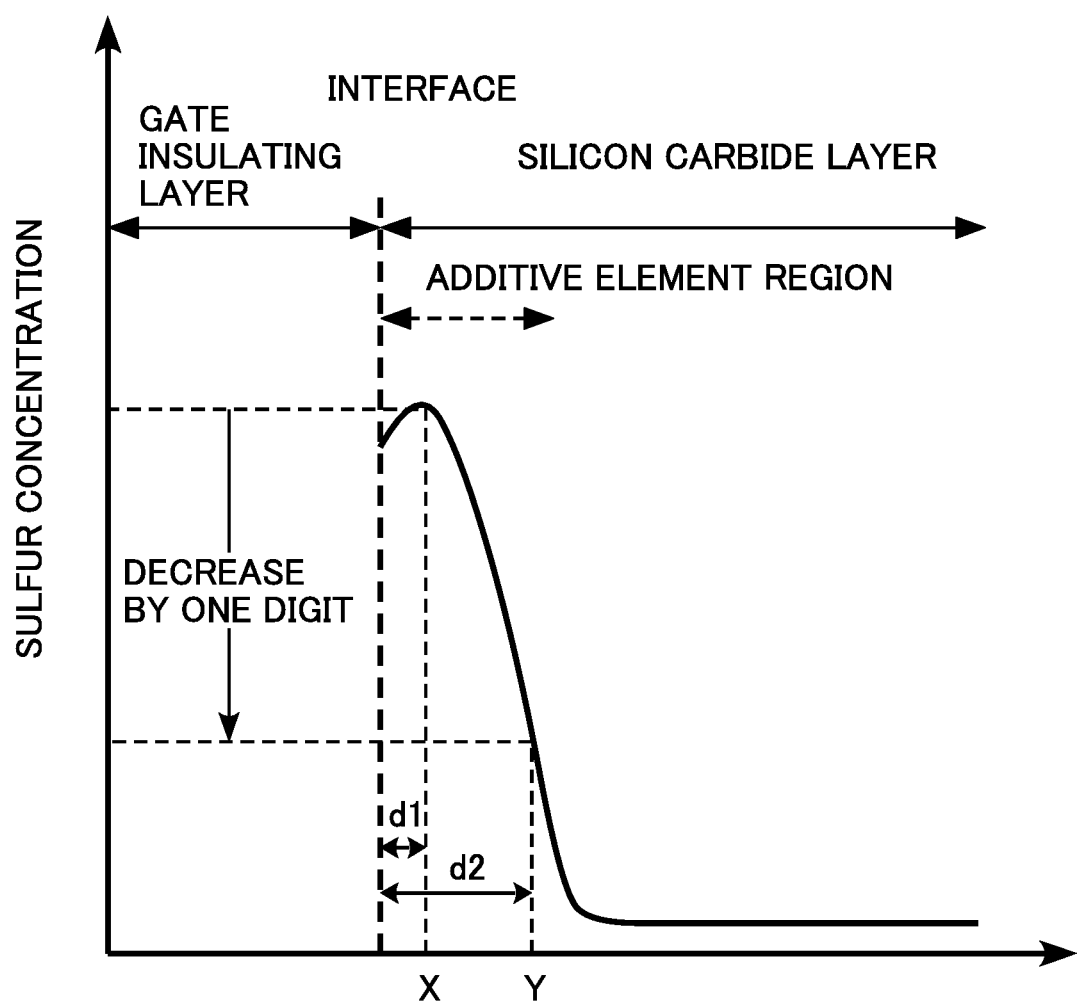
FIG. 4 is a diagram showing a sulfur concentration distribution of the semiconductor device according to the first embodiment.

FIG. 4 is a diagram showing a sulfur concentration distribution of the semiconductor device according to the first embodiment. FIG. 4 shows a concentration distribution of a depth direction of sulfur to be the additive element. FIG. 4 shows a concentration distribution of sulfur in the portion including the additive element portion 28a.

A position where the sulfur concentration is maximized is defined as a first position (X in FIG. 4). A first distance (d1 in FIG. 4) between the first position X and the interface between the gate insulating layer 16 and the silicon carbide layer 10 is equal to or less than 20 nm.

A position where the sulfur concentration is 1/10 of the concentration at the first position X is defined as a second position (Y in FIG. 4). The second position Y is a position where the sulfur concentration is decreased by one digit from the concentration at the first position X. The second position Y is farther from the interface between the gate insulating layer 16 and the silicon carbide layer 10 than the first position X.

A second distance (d2 in FIG. 4) between the second position Y and the interface between the gate insulating layer 16 and the silicon carbide layer 10 is equal to or less than 20 nm. The second distance d2 is larger than the first distance d1.

The sulfur concentration at the first position X is, for example, equal to or more than $1\times10^{17}$ cm$^{-3}$ and equal to or less than $5\times10^{21}$ cm$^{-3}$. The sulfur concentration at the first position X is, for example, equal to or more than $3\times10^{10}$ cm$^{-3}$ and equal to or less than $1\times10^{20}$ cm$^{-3}$.

The presence or absence of sulfur in the additive element portion 28a and the sulfur concentration can be measured by secondary ion mass spectrometry (SIMS), for example.

For identifying the position of the interface, for example, the concentration distribution of the element is measured by SIMS, and a position where the oxygen concentration decreasing from the gate insulating layer 16 toward the silicon carbide layer 10 and the carbon concentration decreasing from the silicon carbide layer 10 to the gate insulating layer 16 are matched is determined as the position of the interface.

Sulfur atoms of the additive element portion 28a exist at positions of carbon atoms (carbon sites) in a crystal structure of silicon carbide. In other words, the sulfur atoms are in a state where the sulfur atoms substitute the carbon atoms in the crystal structure of silicon carbide.

For example, in the additive element portion 28a, a density of the sulfur atoms existing at the positions of the carbon atoms in the crystal structure of silicon carbide is larger than a density of the sulfur atoms existing at the positions of the silicon atoms (silicon sites) in the crystal structure of silicon carbide.

The positions of the sulfur atoms in the crystal structure of silicon carbide can be measured by X-ray photoelectron spectroscopy (XPS), infrared spectroscopy, or Raman spectroscopy, for example. Further, the magnitude relation between the density of the sulfur atoms existing at the positions of the carbon atoms in the crystal structure of silicon carbide and the density of the sulfur atoms existing at the positions of the silicon atoms in the crystal structure of silicon carbide can also be measured by the X-ray photoelectron spectroscopy, the infrared spectroscopy, or the Raman spectroscopy, for example.

The additive element portion 28a includes aluminum as p-type impurities. The sulfur concentration at the first position X is, for example, higher than the aluminum concentration at the first position X. The aluminum concentration at the first position X is, for example, equal to or more than $1\times10^{13}$ cm$^{-3}$ and equal to or less than $1\times10^{17}$ cm$^{-3}$.

Sulfur included in the additive element portion 28a increases a threshold voltage of the MOSFET 100 by forming a negative fixed charge. Further, a buried channel is formed by the negative fixed charge, and the mobility of the MOSFET 100 is improved.

The gate electrode 20 is located on the side of the first plane P1 of the silicon carbide layer 10. The gate electrode 20 is provided on the gate insulating layer 16. The gate insulating layer 16 is interposed between the drift region 26, the source region 30, and the p-well region 28 and the gate electrode 20.

The gate electrode 20 is a conductor. The gate electrode 20 is, for example, polycrystalline silicon including n-type impurities or p-type impurities. The gate electrode 20 may be, for example, a metal such as titanium nitride, tungsten nitride, tungsten, aluminum, copper, ruthenium, cobalt, nickel, cobalt silicide, and nickel silicide or a stacked structure of the metal and polycrystalline silicon including n-type impurities or p-type impurities.

The interlayer insulating layer 22 is formed on the gate electrode 20. The interlayer insulating layer 22 electrically isolates the gate electrode 20 and the source electrode 12. The interlayer insulating layer 22 is, for example, silicon oxide.

The source electrode 12 is located on the side of the first plane P1 of the silicon carbide layer 10. The source electrode 12 is in contact with the source region 30 and the p-well contact region 32. The source electrode 12 is electrically connected to the source region 30 and the p-well contact region 32. The source electrode 12 also functions as a p-well electrode for applying a potential to the p-well region 28.

The source electrode 12 is formed of, for example, a stacked layer of a barrier metal layer of nickel (Ni) and a metal layer of aluminum on the barrier metal layer. The barrier metal layer of nickel and the silicon carbide layer 10 may react to form nickel silicide. The nickel silicide is, for example, NiSi or $Ni_2Si$. The barrier metal layer of nickel and the metal layer of aluminum may form an alloy by reaction.

The drain electrode 14 is located on the side of the second plane P2 of the silicon carbide layer 10. The drain electrode 14 is in contact with the drain region 24. The drain electrode 14 is electrically connected to the drain region 24.

The drain electrode 14 is, for example, nickel. Nickel may react with the silicon carbide layer 10 to form nickel silicide. The nickel silicide is, for example, NiSi or $Ni_2Si$.

In the semiconductor device according to the first embodiment, the n-type impurity is, for example, nitrogen or phosphorus. Arsenic (As) or antimony (Sb) can also be applied as the n-type impurity.

Further, in the semiconductor device according to the first embodiment, the p-type impurity is, for example, aluminum. Boron (B), gallium (Ga), and indium (In) can also be applied as the p-type impurity.

Next, an example of a method for manufacturing the semiconductor device according to the first embodiment will be described.

FIGS. 5 to 10 are schematic cross-sectional views showing an example of the method for manufacturing the semiconductor device according to the first embodiment. FIGS. 5 to 10 show cross-sections corresponding to FIG. 1.

Figure 5:
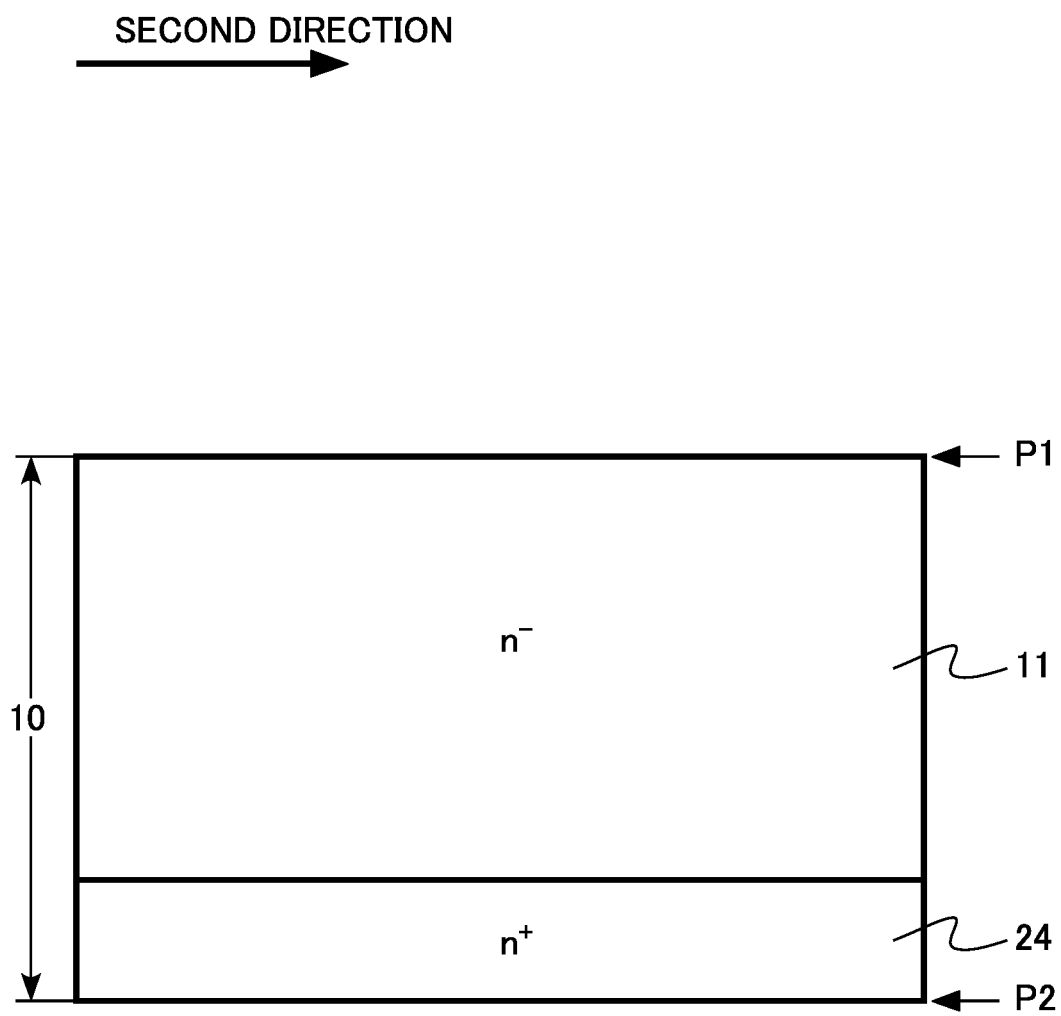
FIG. 5 is a schematic cross-sectional view showing an example of a method for manufacturing the semiconductor device according to the first embodiment.

First, the silicon carbide layer 10 in which an $n^-$-type silicon carbide region 11 is formed on the drain region 24 is prepared (FIG. 5). The $n^-$-type silicon carbide region 11 is formed by, for example, an epitaxial growth method. A part of the silicon carbide region 11 finally becomes the $n^-$-type drift region 26.

Figure 6:
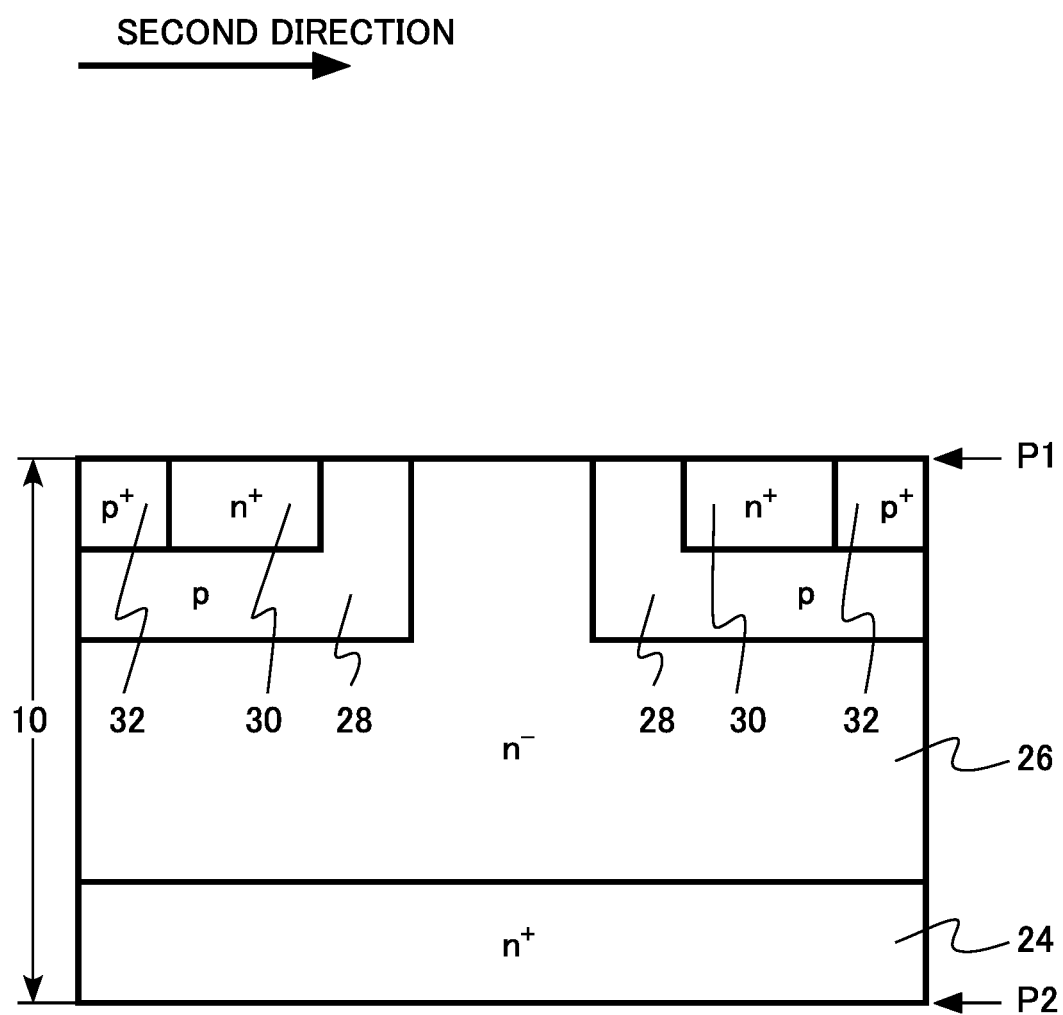
FIG. 6 is a schematic cross-sectional view showing an example of a method for manufacturing the semiconductor device according to the first embodiment.

Next, the p-well region 28, the source region 30, and the p-well contact region 32 are formed in the silicon carbide region 11 using a known lithography method and ion implantation method (FIG. 6).

Figure 7:
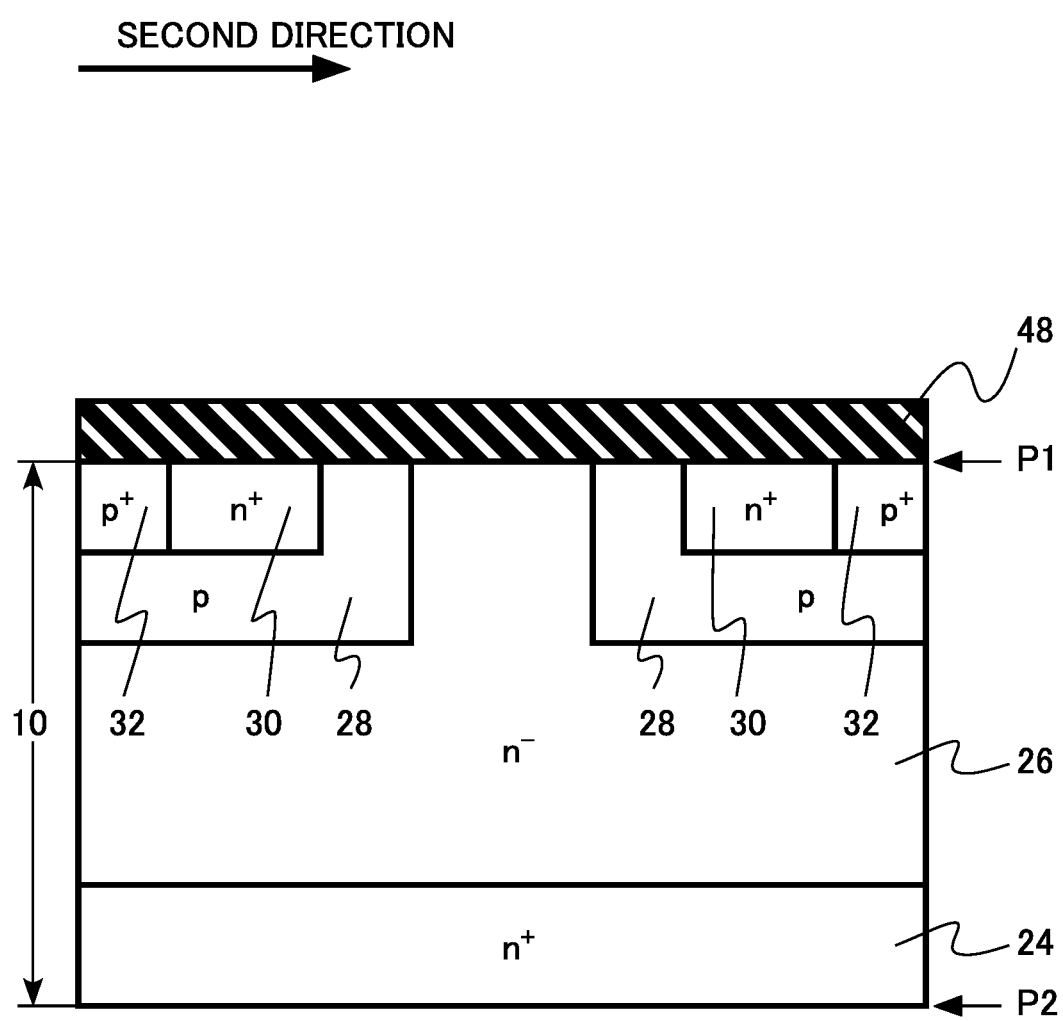
FIG. 7 is a schematic cross-sectional view showing an example of a method for manufacturing the semiconductor device according to the first embodiment.

Next, a sacrificial oxide film 48 is formed on a surface of the silicon carbide layer 10 (FIG. 7). The sacrificial oxide film 48 is, for example, a silicon oxide film formed by thermal oxidation.

By forming the sacrificial oxide film 48, many carbon vacancies are formed in the vicinity of the surface of the silicon carbide layer 10. The carbon vacancies are in a state where the carbon atoms are missing from the crystal structure of silicon carbide.

Figure 8:
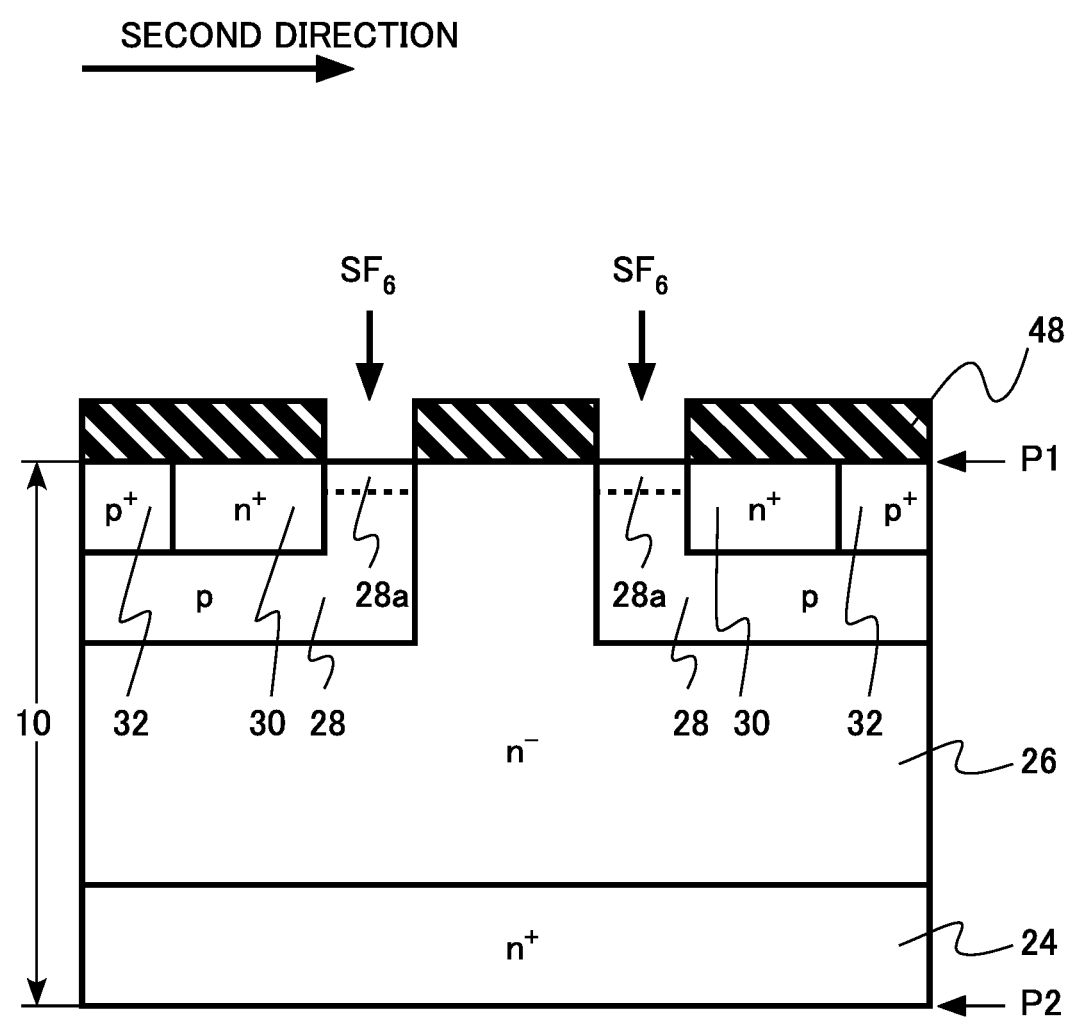
FIG. 8 is a schematic cross-sectional view showing an example of a method for manufacturing the semiconductor device according to the first embodiment.

Next, the sacrificial oxide film 48 on the p-well region 28 is selectively removed by a known lithography method and dry etching method. Next, heat treatment is performed in an atmosphere including sulfur (FIG. 8). For example, the heat treatment is performed in sulfur hexafluoride ($SF_6$) gas.

By performing the heat treatment in the atmosphere including sulfur, sulfur diffuses from the face of the silicon carbide layer 10 into the silicon carbide layer 10. The diffused sulfur fills many carbon vacancies formed in the vicinity of the surface of the silicon carbide layer 10. In other words, many sulfur atoms exist at the carbon sites.

A portion including sulfur in the p-well region 28 becomes the additive element portion 28a.

Figure 9:
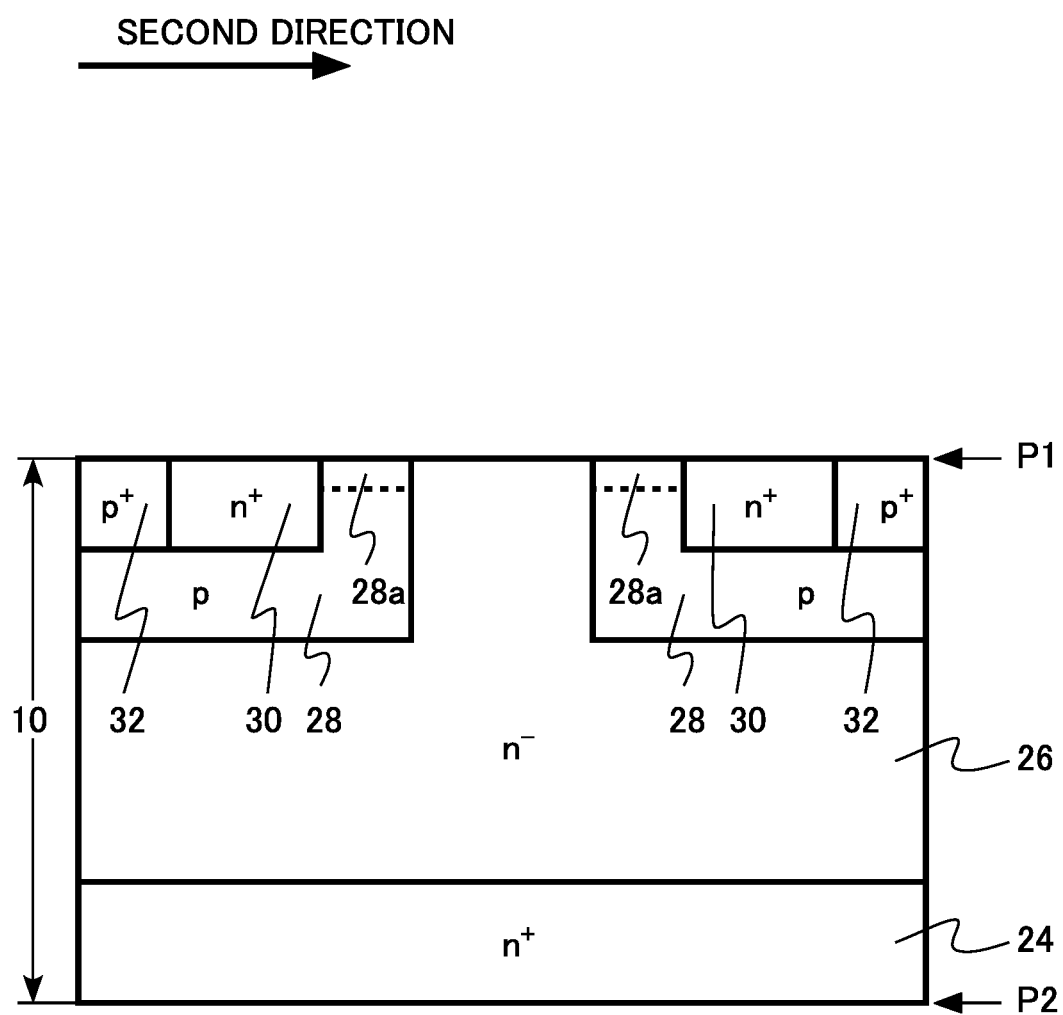
FIG. 9 is a schematic cross-sectional view showing an example of a method for manufacturing the semiconductor device according to the first embodiment.

Next, the sacrificial oxide film 48 is removed using a known wet etching method (FIG. 9).

Figure 10:
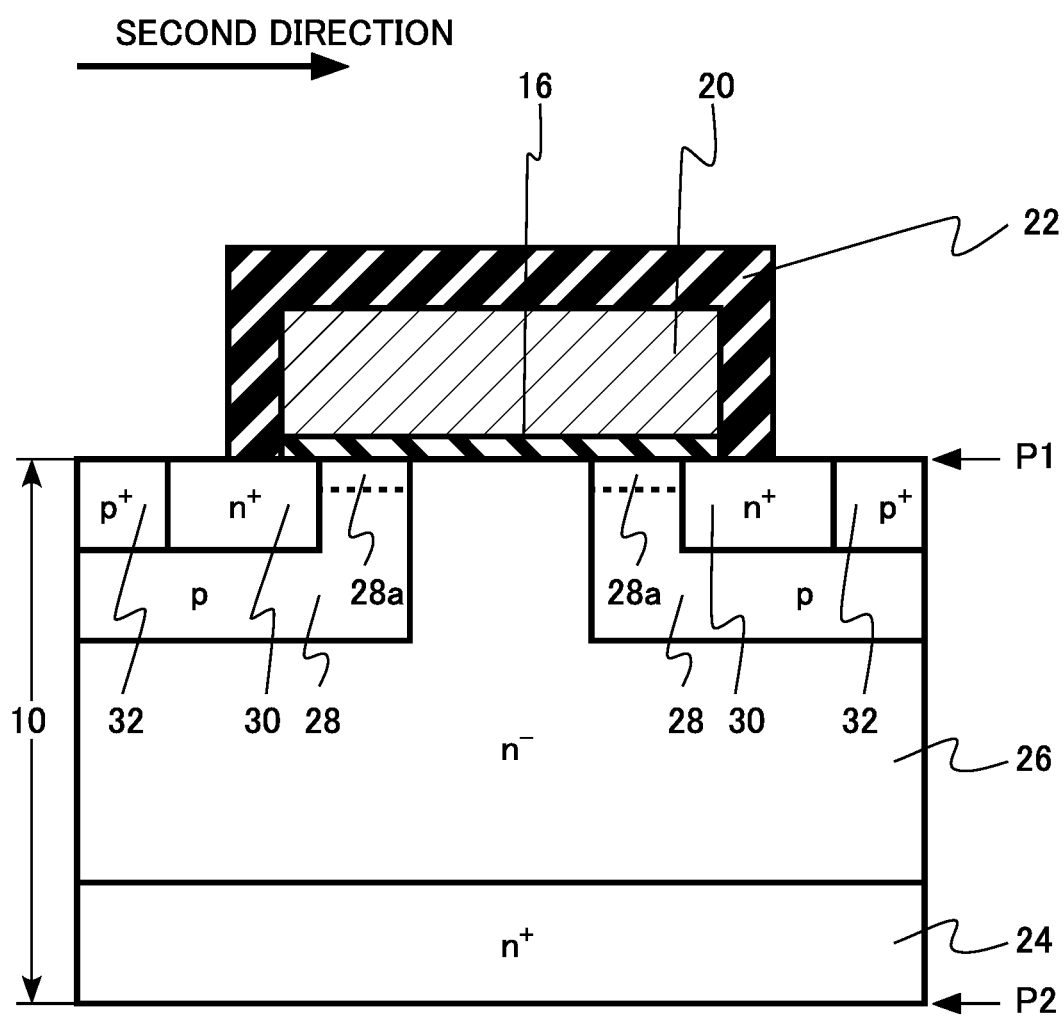
FIG. 10 is a schematic cross-sectional view showing an example of a method for manufacturing the semiconductor device according to the first embodiment.

Next, the gate insulating layer 16 and the gate electrode 20 are formed on the surface of the silicon carbide layer 10 using known process technology. The gate insulating layer 16 and the gate electrode 20 are formed using, for example, chemical vapor deposition. Further, the interlayer insulating layer 22 is formed on the gate electrode 20 using the known process technology (FIG. 10).

Thereafter, the source electrode 12 and the drain electrode 14 are formed using the known process technology. The MOSFET 100 shown in FIG. 1 is manufactured by the above manufacturing method.

Next, functions and effects of the semiconductor device according to the first embodiment will be described.

MOSFETs using silicon carbide tend to have lower threshold voltages and lower mobility than, for example, MOSFETs using silicon. Therefore, a MOSFET capable of realizing a high threshold voltage and high mobility is desired.

In the MOSFET 100 according to the first embodiment, the p-well region 28 has the additive element portion 28a including sulfur. By having the additive element portion 28a, the MOSFET 100 realizes the high threshold voltage and the high mobility. The details will be described below.

Figure 11A:
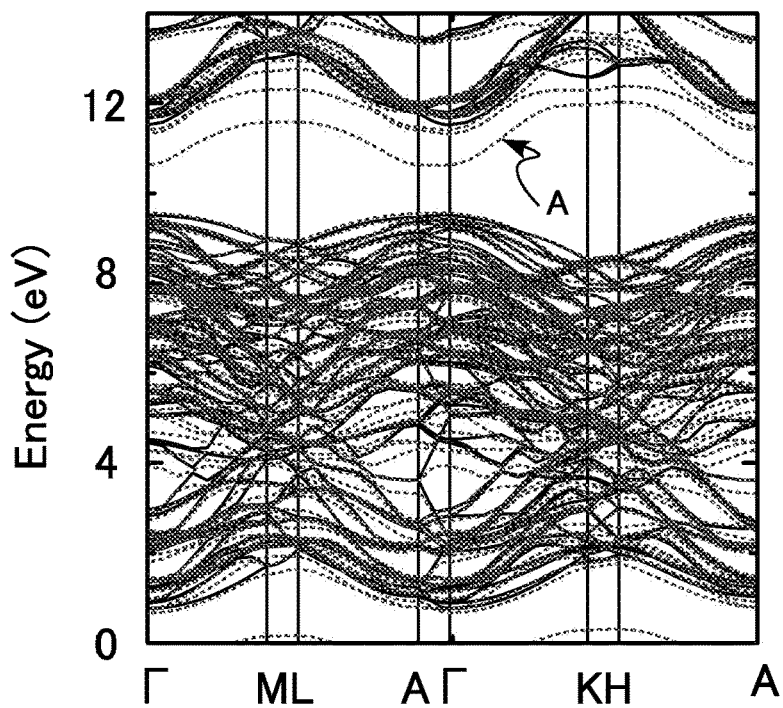
FIGS. 11A and 11B are diagrams showing electronic states of the semiconductor device according to the first embodiment.
Figure 11B:
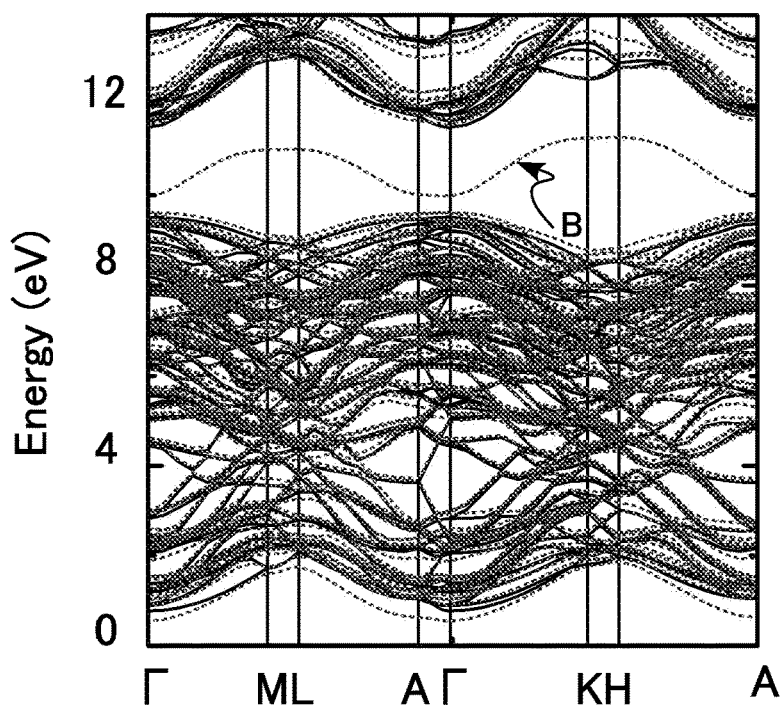

FIGS. 11A and 11B are diagrams showing electronic states of the semiconductor device according to the first embodiment. The electronic state when sulfur exists in the silicon carbide layer 10 is obtained by a first principle calculation.

FIG. 11A shows a case where the sulfur atoms exist at the positions of the silicon atoms (silicon sites) in the crystal structure of silicon carbide, and FIG. 11B shows a case where the sulfur atoms exist at the positions of the carbon atoms (carbon sites) in the crystal structure of silicon carbide.

As shown in FIG. 11A, when the sulfur atoms exist at the silicon sites, a shallow level (A in FIG. 11A) relatively close to an upper side of a band gap, that is, a lower end of a conduction band is formed. On the other hand, when the sulfur atoms exist at the carbon sites, a deep level (B in FIG. 11B) relatively close to a lower side of the band gap, that is, an upper end of a valence band is formed.

In the MOSFET 100 according to the first embodiment, the sulfur atoms of the additive element portion 28a exist at the carbon sites. Therefore, a deep level is formed in the additive element portion 28a.

Figure 12A:
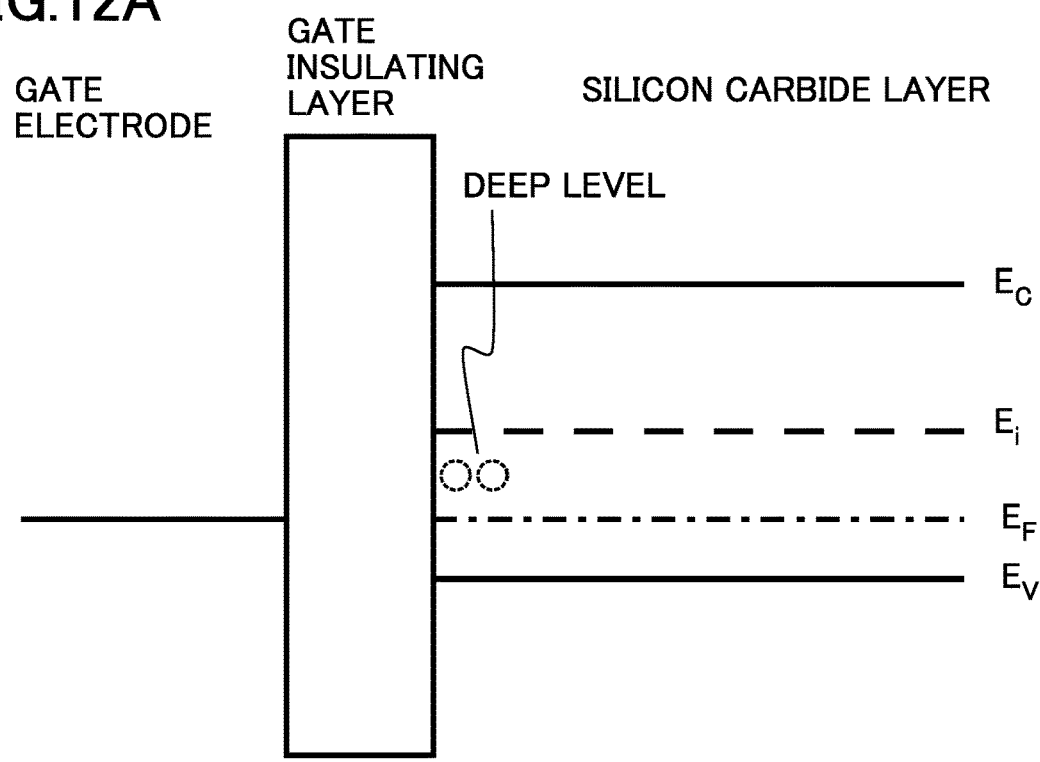
FIGS. 12A and 12B are diagrams illustrating functions and effects of the semiconductor device according to the first embodiment.
Figure 12B:
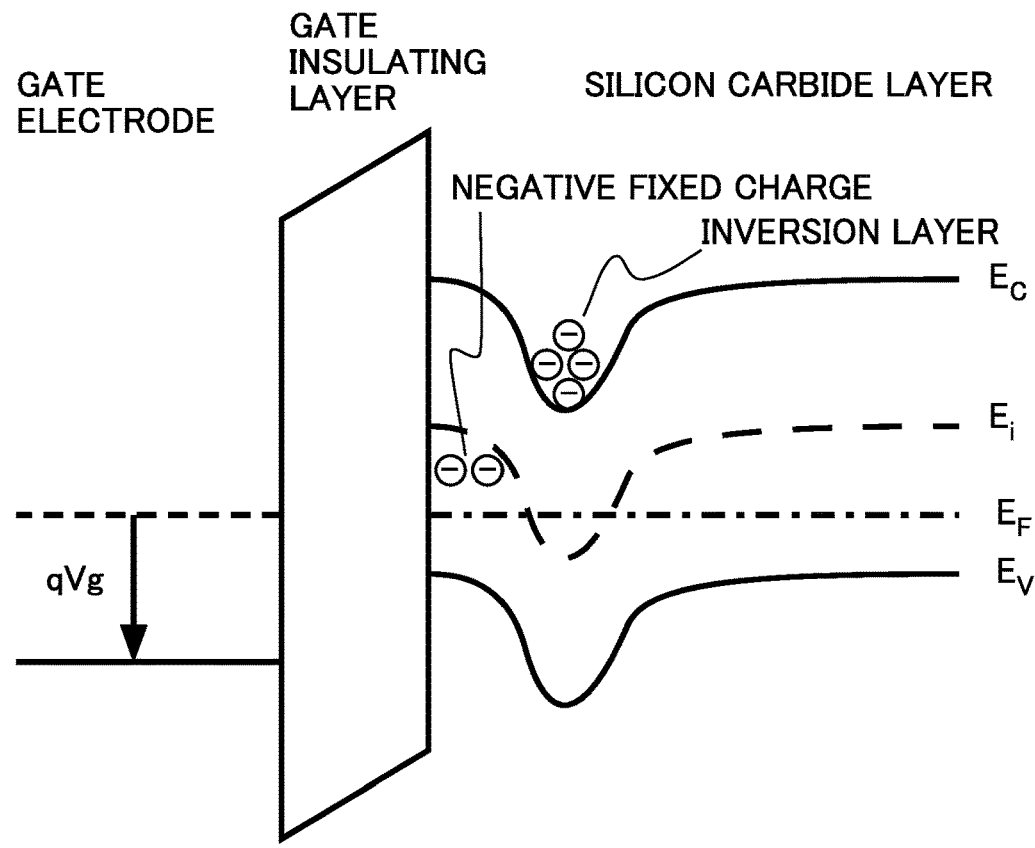

FIGS. 12A and 12B are diagrams illustrating functions and effects of the semiconductor device according to the first embodiment. FIGS. 12A and 12B are band diagrams of a MOS structure of the MOSFET 100.

FIG. 12A is a band diagram of a flat band state where a voltage is not applied between the source electrode 12 and the gate electrode 20. FIG. 12B is a band diagram of a state where a positive voltage (Vg in FIG. 12B) is applied to the gate electrode 20 and an inversion layer is formed.

As shown in FIG. 12A, in the vicinity of the Interface between the silicon carbide layer 10 and the gate insulating layer 16, there is a deep level formed by the sulfur atoms entering the carbon sites. As shown in FIG. 12B, if the positive voltage is applied to the gate electrode 20, a potential in the vicinity of the interface decreases.

If the potential in the vicinity of the interface decreases, electrons are induced. As shown in FIG. 12B, the electrons are trapped at a deep level to form a negative fixed charge. The negative fixed charge is formed in the vicinity of the interface, so that the threshold voltage of the MOSFET 100 increases.

If the negative fixed charge is formed in the vicinity of the interface, the potential in the vicinity of the interface increases. Therefore, as shown in FIG. 12B, the inversion layer is formed at a deep position away from the vicinity of the interface. A so-called buried channel is formed.

If the buried channel is formed, the electrons flow away from the vicinity of the interface. Therefore, interface scattering of the electrons is suppressed, and the mobility of the MOSFET 100 increases.

The carbon vacancies in the silicon carbide layer 10 form a shallow level close to the lower end of the conduction band. The mobility of the MOSFET 100 is reduced by the shallow level. In the MOSFET 100, sulfur included in the additive element portion 28a fills the carbon vacancies, so that the amount of carbon vacancies is reduced. Therefore, the mobility of the MOSFET 100 increases.

Further, if the carbon vacancies exist in the silicon carbide layer, the surface of the silicon carbide layer is easily oxidized. If the surface of the silicon carbide layer is oxidized, the carbon vacancies are further formed. When the surface of the silicon carbide layer is oxidized, carbon defects due to carbon diffused into the gate insulating layer occur. For this reason, the mobility of the MOSFET and the reliability of the gate insulating layer are reduced.

In the MOSFET 100, sulfur included in the additive element portion 28a fills the carbon vacancies, so that the amount of carbon vacancies is reduced. Therefore, oxidation resistance of the surface of the silicon carbide layer 10 is improved. Therefore, the amount of carbon vacancies in the silicon carbide layer 10 and the amount of carbon diffused into the gate insulating layer 16 are reduced. As a result, the mobility of the MOSFET 100 is increased. At the same time, the reliability of the gate insulating layer 16 is improved.

The position where the sulfur concentration is maximized in the MOSFET 100 is defined as the first position (X in FIG. 4). A first distance (d1 in FIG. 4) between the first position X and the interface between the gate insulating layer 16 and the silicon carbide layer 10 is equal to or less than 20 nm. Further, the second distance (d2 in FIG. 4) between the second position (Y in FIG. 4) where the sulfur concentration is 1/10 of the sulfur concentration at the first position X and the Interface between the gate insulating layer 16 and the silicon carbide layer 10 is equal to or less than 20 nm.

If the first distance d1 and the second distance d2 are larger than 20 nm, the buried channel is separated from the interface, so that controllability by the gate voltage of the MOSFET 100 is deteriorated. Therefore, it is necessary to increase an operation voltage. As a result, for example, a leakage current of the gate insulating layer increases, a leakage current between the source and the drain increases, or a short channel effect increases, which causes problems.

The first distance d1 and the second distance d2 can be extremely decreased by formation of the carbon vacancies limited to the vicinity of the surface by formation of the sacrificial oxide film 48, for example. The sulfur atoms filling the carbon vacancies exist in only the region limited to the vicinity of the surface.

It is energetically stable that the interstitial sulfur atoms in the silicon carbide layer substitute silicon of silicon carbide and enter the silicon sites. As described above, if the sulfur atoms enter the silicon sites, the shallow level is formed. For this reason, for example, the threshold voltage of the MOSFET may decrease or the mobility may decrease, which is not preferable.

For example, by forming a large amount of carbon vacancies in the vicinity of the surface of the silicon carbide layer 10 by formation of the sacrificial oxide film 48, the sulfur atoms enter the carbon sites more easily than the silicon sites. The additive element portion 28a of the MOSFET 100 can be formed by the above method.

The sulfur concentration at the first position X is preferably equal to or more than $1\times10^{17}$ cm$^{-3}$, is more preferably equal to or more than $3\times10^{18}$ cm$^{-3}$, is further preferably equal to or more than $5\times10^{18}$ cm$^{-3}$, and is most preferably equal to or more than $1\times10^{19}$ cm$^{-3}$. By exceeding the above range, the threshold voltage and the mobility of the MOSFET 100 become higher.

The sulfur concentration at the first position X is preferably equal to or less than $5\times10^{21}$ cm$^{-3}$ and is more preferably equal to or less than $1\times10^{20}$ cm$^{-3}$. By falling below the above range, the amount of sulfur atoms entering the silicon sites is suppressed, and the threshold voltage and the mobility of the MOSFET 100 become higher.

In the additive element portion 28a, the density of the sulfur atoms existing at the positions of the carbon atoms in the crystal structure of silicon carbide is preferably larger than the density of the sulfur atoms existing at the positions of the silicon atoms in the crystal structure of silicon carbide. Many deep levels capable of forming the negative fixed charge can be formed. With the above method for forming the carbon vacancies by formation of the sacrificial oxide film 48 and diffusing sulfur into the carbon vacancy positions, almost all sulfur can be reliably put into the carbon atom positions. Since the amount or position of carbon vacancies can be adjusted by the temperature or oxygen amount when the sacrificial oxide film 48 is formed, the amount or position of sulfur introduced into the additive element portion 28a can be controlled.

From the viewpoint of improving the controllability by the gate voltage of the MOSFET 100, the first distance d1 and the second distance d2 are preferably equal to or less than 10 nm and is more preferably equal to or less than 5 nm. For example, the first distance d1 and the second distance d2 can be adjusted short by ion-implanting the carbon atoms in the depth direction of the silicon carbide layer 10 and closing the carbon vacancies at the deep positions of the silicon carbide layer 10. That is, it is possible to cause the additive element portion 28a to be shallow. By the above method, the carbon vacancies can be eliminated steeply in the depth direction, so that the distribution of the first element can have a steep profile in only the vicinity of the surface. As a result, the controllability by the gate voltage of the MOSFET 100 can be improved.

From the viewpoint of increasing the threshold voltage and the mobility of the MOSFET 100, in the additive element portion 28a, the sulfur concentration at the first position X is preferably higher than the aluminum concentration at the first position X.

As described above, according to the first embodiment, a MOSFET capable of realizing a high threshold voltage is provided. Further, a MOSFET capable of realizing high mobility is provided.

Second Embodiment

A semiconductor device according to a second embodiment is different from the semiconductor device according to the first embodiment in that each of a silicon carbide layer and a gate insulating layer includes at least one second element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu), and a distance from a third position where a concentration of the second element is maximized to an interface is equal to or less than 5 nm. Hereinafter, description of contents overlapping with those of the first embodiment will be partially omitted.

The semiconductor device according to the second embodiment is a vertical MOSFET 200. The MOSFET 200 is an n-channel transistor using electrons as carriers. The MOSFET 200 has the same structure as the MOSFET 100 according to the first embodiment, except that the MOSFET 200 includes termination elements (second elements).

In the MOSFET 200, each of a silicon carbide layer 10 and a gate insulating layer 16 includes at least one termination element (second element) selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu). Hereinafter, a case where the termination element is nitrogen (N) will be described as an example.

Figure 13:
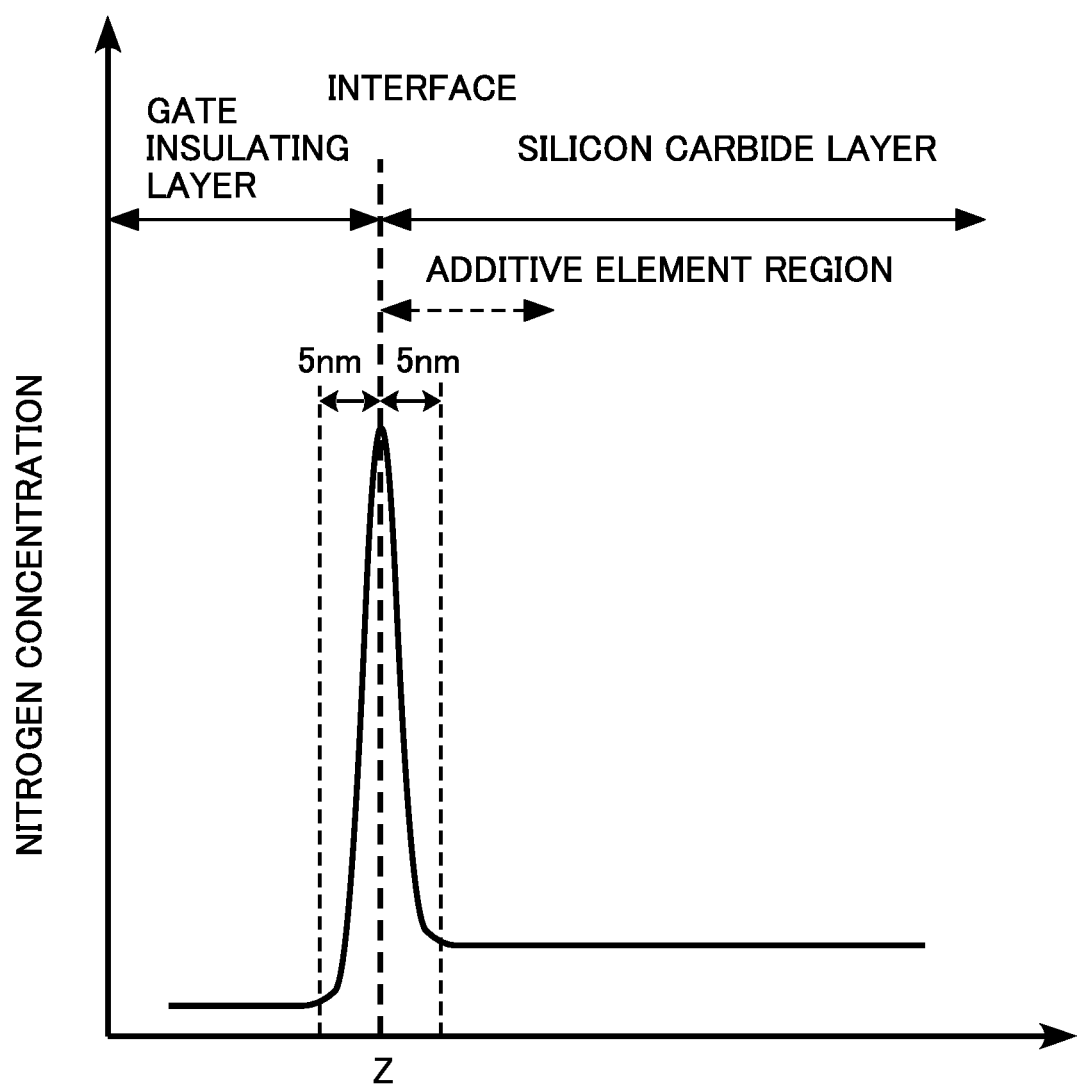
FIG. 13 is a diagram showing a nitrogen concentration distribution of a semiconductor device according to a second embodiment.

FIG. 13 is a diagram showing a nitrogen concentration distribution of the semiconductor device according to the second embodiment. FIG. 13 shows a concentration distribution of a depth direction of nitrogen to be the termination element. FIG. 13 shows the nitrogen concentration distribution of a portion including an additive element portion 28a.

The distance from the third position (Z in FIG. 13) where the nitrogen concentration is maximized to the interface is equal to or less than 5 nm. In other words, the third position Z is in a range of equal to or less than 5 nm from the interface. FIG. 13 shows a case where the third position Z and the interface are aligned.

The distance from the third position Z to the interface is preferably equal to or less than 2 nm and is more preferably equal to or less than 1 nm. A full width at half maximum with respect to a peak of the nitrogen concentration distribution is, for example, equal to or less than 1 nm. Further, the full width at half maximum with respect to the peak of the concentration distribution is preferably equal to or less than 0.25 nm, for example.

The termination element (second element) substitutes silicon atoms or carbon atoms of a bilayer C pair) configuring an uppermost layer of a p-well region 28. In the case of nitrogen, the carbon atoms of the bilayer configuring the uppermost layer are substituted. The above termination elements (for example, phosphorus, antimony, lanthanum, and the like) other than nitrogen substitute the silicon atoms of the bilayer configuring the uppermost layer. Excess silicon atoms or carbon atoms are emitted to the side of the gate insulating layer, and the termination element is finally bonded to the silicon carbide layer 10 in a three-coordination manner. For example, nitrogen is at the positions of the carbon atoms in a crystal structure of silicon carbide. A part of the outermost silicon is absorbed into the side of the insulating film, and nitrogen is three-coordinated with the silicon atoms of the silicon carbide layer 10. The above termination elements (for example, phosphorus, antimony, lanthanum, and the like) other than nitrogen are at the positions of the silicon atoms in the crystal structure of silicon carbide. The termination elements other than nitrogen are three-coordinated with the carbon atoms of the silicon carbide layer 10.

A peak value of the nitrogen concentration distribution is, for example, equal to or more than $4\times10^{19}$ cm$^{-3}$ and equal to or less than $4\times10^{23}$ cm$^{-3}$. In order to ensure the termination, the peak value is preferably equal to or more than $1\times10^{21}$ cm$^{-3}$. On the other hand, if there is excess nitrogen, this causes charge trapping, so that the peak value is preferably equal to or less than $1\times10^{23}$ cm$^{-3}$. Typically, for example, the peak value is about $5.0\times10^{22}$ cm$^{-3}$ (±5%), which particularly shows good characteristics with few charge trapping. An area density at the interface is preferably equal to or more than $1\times10^{14}$ cm$^{-2}$ and equal to or less than $2.5\times10^{15}$ cm$^{-2}$. Typically, for example, the area density is about $1.4\times10^{15}$ cm$^{-2}$ (±5%), which particularly shows good characteristics with few charge trapping.

The nitrogen concentration in the gate insulating layer 16 and the silicon carbide layer 10 is, for example, equal to or less than $2\times10^{16}$ cm$^{-3}$.

The concentration and distribution of nitrogen can be measured by SIMS, for example.

The MOSFET 200 according to the second embodiment can be manufactured by adding heat treatment in an atmosphere including nitrogen after forming the additive element portion 28a to the method for manufacturing the MOSFET 100 according to the first embodiment.

In the case of forming the MOSFET using silicon carbide, it is considered that one factor decreasing the mobility of electrons is an interface state existing at the interface between the silicon carbide layer and the gate insulating layer. It is considered that the mobility of the electrons decreases due to trapping or scattering of the electrons by the interface state.

It is considered that the interface state between the silicon carbide layer and the gate insulating layer is generated by dangling bonds of the silicon atoms or the carbon atoms in the uppermost layer of the silicon carbide layer.

In the MOSFET 200 according to the second embodiment, nitrogen substitutes the carbon atoms of the bilayer configuring the uppermost layer to form three-coordination, and the dangling bonds are reduced. Therefore, an amount of interface states between silicon carbide layer 10 and the gate insulating layer 16 is reduced. Therefore, the mobility of the MOSFET 200 increases.

As described above, according to the second embodiment, similarly to the first embodiment, a MOSFET capable of realizing a high threshold voltage is provided. Further, a MOSFET capable of realizing higher mobility is provided.

Third Embodiment

A semiconductor device according to a third embodiment is different from the semiconductor device according to the first embodiment in that a silicon carbide layer has a trench and a gate electrode is located in the trench. Hereinafter, description of contents overlapping with those of the first embodiment will be partially omitted.

Figure 14:
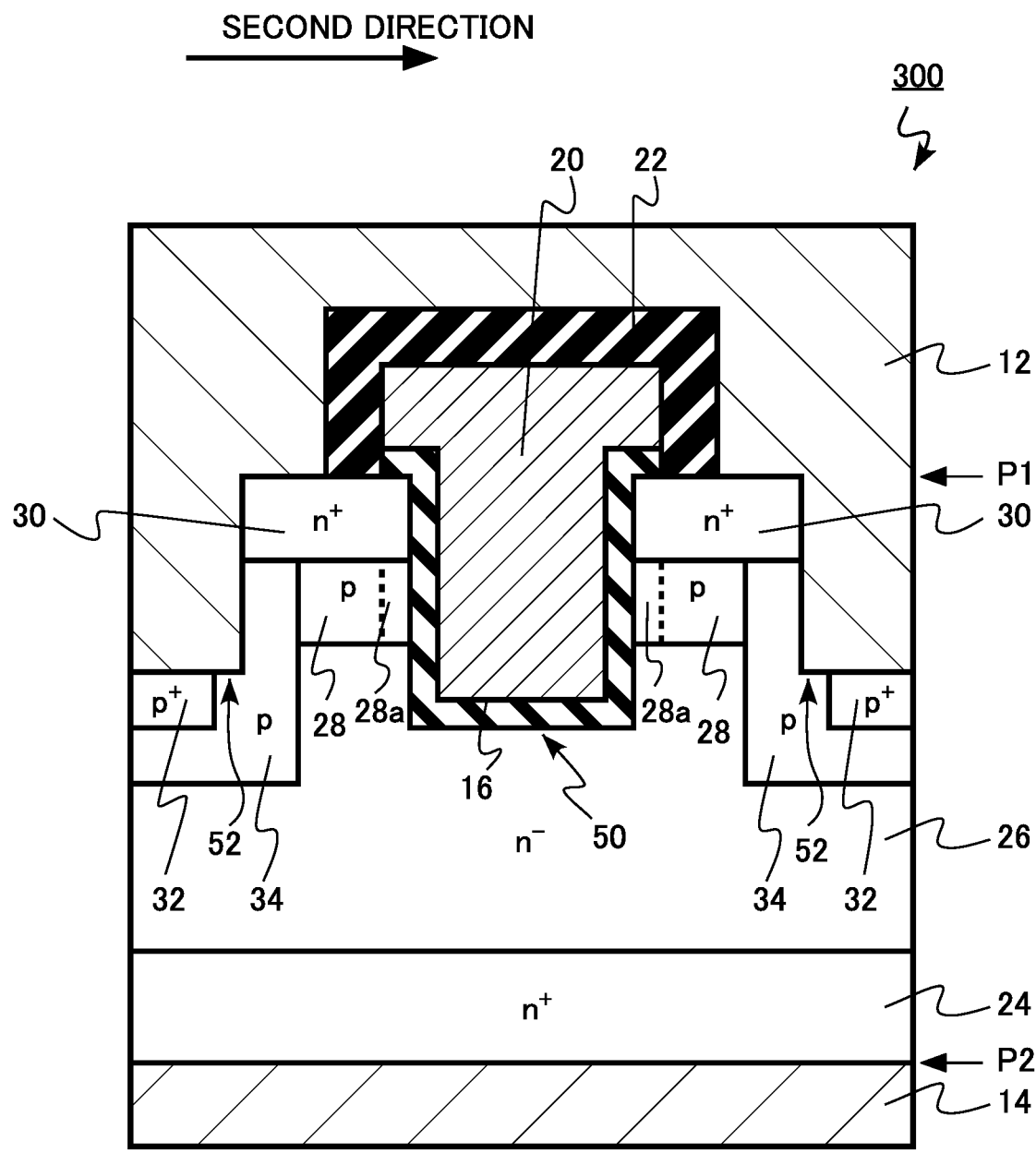
FIG. 14 is a schematic cross-sectional view of a semiconductor device according to a third embodiment.

FIG. 14 is a schematic cross-sectional view of the semiconductor device according to the third embodiment. The semiconductor device according to the third embodiment is a trench gate type vertical MOSFET 300 having a gate electrode in a trench. The MOSFET 300 is an n-channel transistor using electrons as carriers.

The MOSFET 300 includes a silicon carbide layer 10, a source electrode 12 (first electrode), a drain electrode (second electrode), a gate insulating layer 16, a gate electrode 20, an interlayer insulating layer 22, a first trench 50, and second trenches 52.

In the silicon carbide layer 10, a drain region 24, a drift region 26, a p-well region 28, a source region 30, a p-well contact region 32, and a field relaxation region 34 exist. The p-well region 28 has an additive element portion 28a.

The additive element portion 28a is located in a portion in contact with the gate insulating layer 16 in the p-well region.

The silicon carbide layer 10 includes the first trench 50 and the second trenches 52. The first trench 50 is sandwiched between the two second trenches 52. The first trench 50 and the second trench 52 are grooves formed in the silicon carbide layer 10.

The first trench 50 penetrates the p-well region 28 and reaches the drift region 26. A bottom face of the first trench 50 is located in the drift region 26.

The gate electrode 20 is located in the first trench 50.

The gate insulating layer 16 is located in the first trench 50. The gate insulating layer 16 is located between the gate electrode 20 and the silicon carbide layer 10. The additive element portion 28a in the vicinity of the gate insulating layer 16 becomes a channel region of the MOSFET 300.

The surface of the silicon carbide layer 10 in contact with the gate insulating layer 16 is, for example, an m-face.

A part of the source electrode 12 is located in the second trench 52. The p-well contact region 32 is located in a bottom portion of the second trench 52.

The field relaxation region 34 is p-type SiC. The field relaxation region 34 is located around the second trench 52.

The field relaxation region 34 includes aluminum (Al) as p-type impurities, for example. A p-type impurity concentration of the field relaxation region 34 is, for example, equal to or more than $1 \times 10^{16}$ cm$^{-3}$ and equal to or less than $1 \times 10^{20}$ cm$^{-3}$.

A depletion layer extends from the field relaxation region 34 to the drift region 26 when the MOSFET 300 is turned off. By the depletion layer extending to the drift region 26, the field strength applied to the gate insulating layer 16 of the bottom portion of the first trench 50 is reduced. Therefore, a breakdown voltage of the gate insulating layer 16 is improved.

As described above, according to the third embodiment, similarly to the first embodiment, a MOSFET capable of realizing a high threshold voltage is provided. Further, a MOSFET capable of realizing high mobility is provided. Further, by adopting the trench gate type, a MOSFET in which a channel density is increased and on-resistance is reduced is provided.

Fourth Embodiment

A drive device according to a fourth embodiment is a drive device including the semiconductor device according to the first embodiment.

Figure 15:
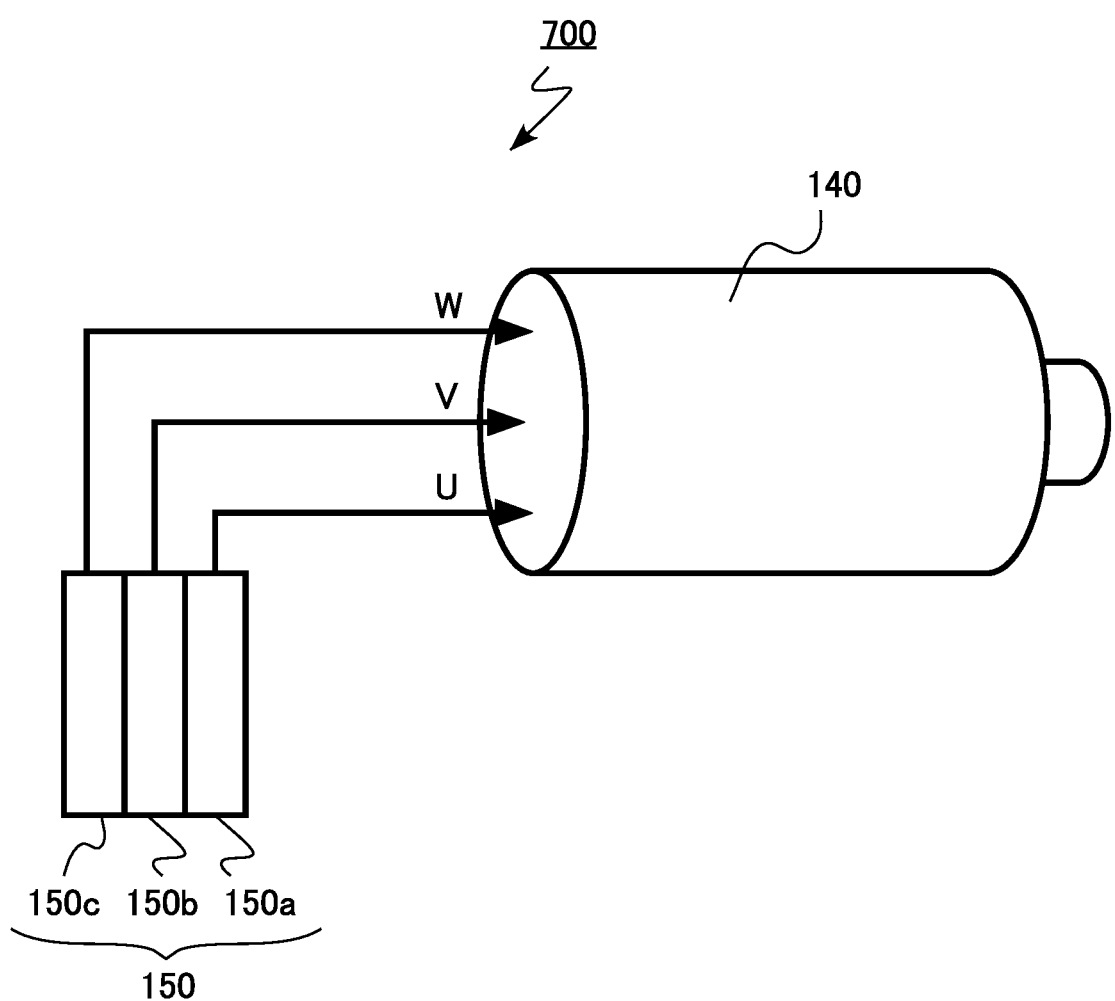
FIG. 15 is a schematic diagram of a drive device according to a fourth embodiment.

FIG. 15 is a schematic diagram of the drive device according to the fourth embodiment. A drive device 700 includes a motor 140 and an inverter circuit 150.

The inverter circuit 150 is composed of three semiconductor modules 150a, 150b, and 150c using the MOSFET 100 according to the first embodiment as a switching element. By connecting the three semiconductor modules 150a, 150b, and 150c in parallel, the three-phase inverter circuit 150 having three AC voltage output terminals U, V, and W is realized. The motor 140 is driven by an AC voltage output from the inverter circuit 150.

According to the fourth embodiment, characteristics of the inverter circuit 150 and the drive device 700 are improved by including the MOSFET 100 having improved characteristics.

Fifth Embodiment

A vehicle according to a fifth embodiment is a vehicle including the semiconductor device according to the first embodiment.

Figure 16:
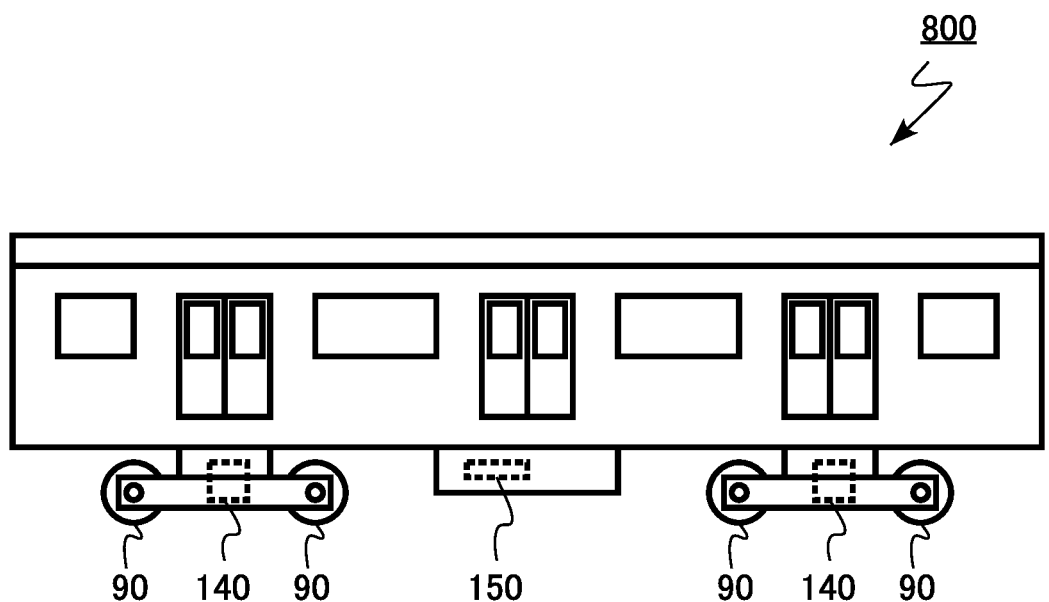
FIG. 16 is a schematic diagram of a vehicle according to a fifth embodiment.

FIG. 16 is a schematic diagram of the vehicle according to the fifth embodiment. A vehicle 800 according to the fifth embodiment is a railroad vehicle. The vehicle 800 includes motors 140 and an inverter circuit 150.

The inverter circuit 150 is composed of three semiconductor modules using the MOSFET 100 according to the first embodiment as a switching element. By connecting the three semiconductor modules in parallel, the three-phase inverter circuit 150 having three AC voltage output terminals U, V, and W is realized. The motor 140 is driven by an AC voltage output from the inverter circuit 150. Wheels 90 of the vehicle 800 are rotated by the motor 140.

According to the fifth embodiment, characteristics of the vehicle 800 are improved by including the MOSFET 100 having improved characteristics.

Sixth Embodiment

A vehicle according to a sixth embodiment is a vehicle including the semiconductor device according to the first embodiment.

Figure 17:
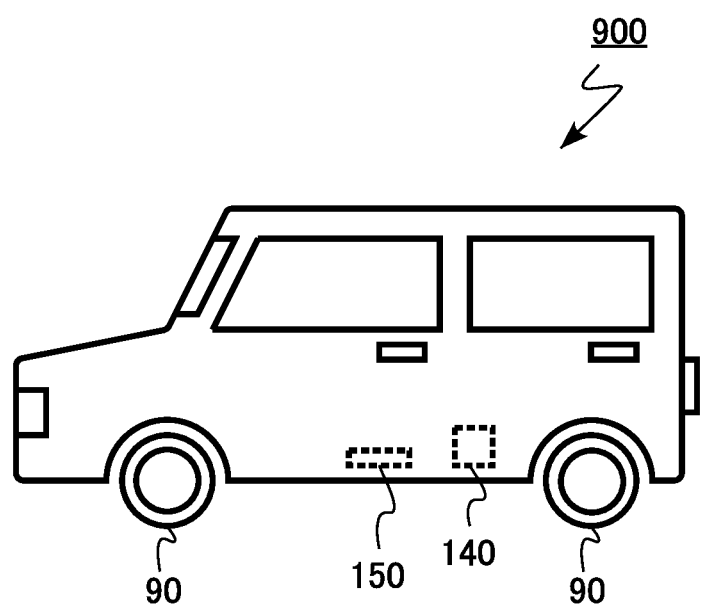
FIG. 17 is a schematic diagram of a vehicle according to a sixth embodiment.

FIG. 17 is a schematic diagram of the vehicle according to the sixth embodiment. A vehicle 900 according to the sixth embodiment is an automobile. The vehicle 900 includes a motor 140 and an inverter circuit 150.

The inverter circuit 150 is composed of three semiconductor modules using the MOSFET 100 according to the first embodiment as a switching element. By connecting the three semiconductor modules in parallel, the three-phase inverter circuit 150 having three AC voltage output terminals U, V, and W is realized.

The motor 140 is driven by an AC voltage output from the inverter circuit 150. Wheels 90 of the vehicle 900 are rotated by the motor 140.

According to the sixth embodiment, characteristics of the vehicle 900 are improved by including the MOSFET 100 having improved characteristics.

Seventh Embodiment

An elevator according to a seventh embodiment is an elevator including the semiconductor device according to the first embodiment.

Figure 18:
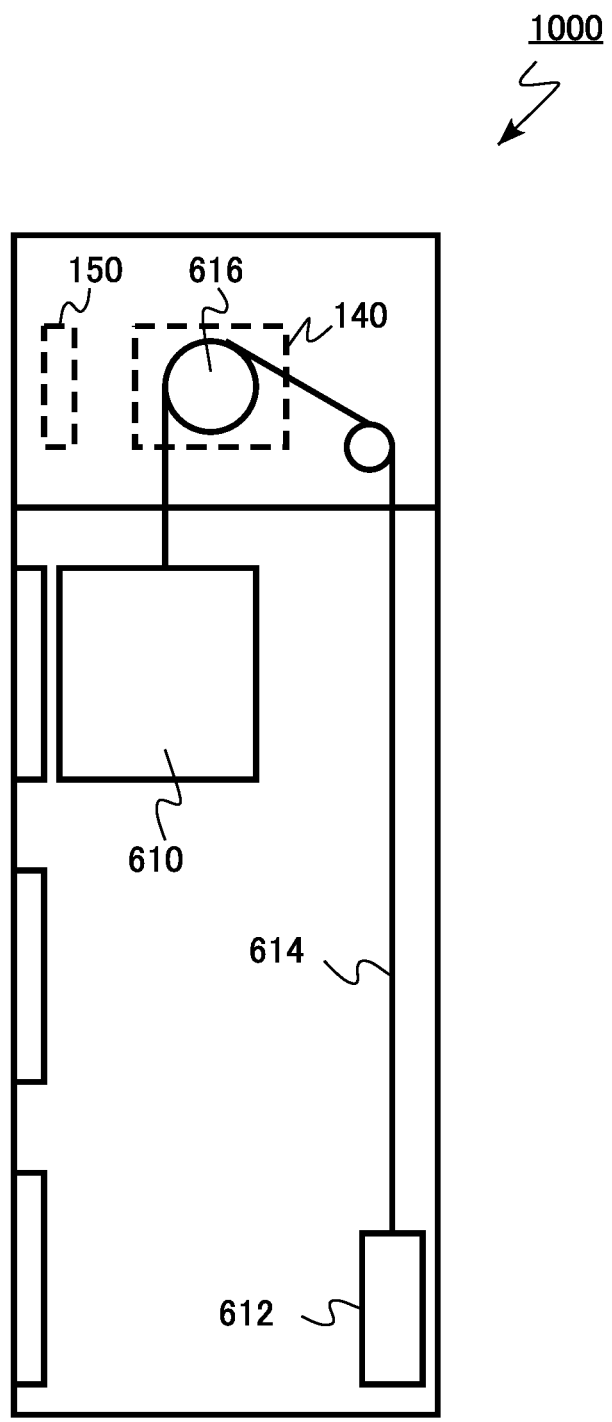
FIG. 18 is a schematic diagram of an elevator according to a seventh embodiment.

FIG. 18 is a schematic diagram of the elevator according to the seventh embodiment. An elevator 1000 according to the seventh embodiment includes a car 610, a counter weight 612, a wire rope 614, a winding machine 616, a motor 140, and an inverter circuit 150.

The inverter circuit 150 is composed of three semiconductor modules using the MOSFET 100 according to the first embodiment as a switching element. By connecting the three semiconductor modules in parallel, the three-phase inverter circuit 150 having three AC voltage output terminals U, V, and W is realized.

The motor 140 is driven by an AC voltage output from the inverter circuit 150. The winding machine 616 is rotated by the motor 140 and the car 610 is elevated.

According to the seventh embodiment, characteristics of the elevator 1000 are improved by including the MOSFET 100 having improved characteristics.

As described above, in the first to third embodiments, the case where 4H—SiC is used as the crystal structure of silicon carbide has been described as an example. However, the present disclosure can be applied to silicon carbide of a crystal structure such as 3C—SiC or 6H—SiC.

Further, in the first to third embodiments, the case where the gate insulating layer 16 is provided on the silicon face of silicon carbide or the m-face has been described as an example. However, the present disclosure can be applied to a case where the gate insulating layer 16 is provided on other face of silicon carbide, for example, an a-face, a (0-33-8) face, or the like.

Further, the present disclosure can be applied to an n-channel insulated gate bipolar transistor (IGBT).

Further, the present disclosure can be applied to a horizontal transistor in which a source electrode and a drain electrode are provided on the same face of a silicon carbide layer, instead of the vertical transistor.

Further, in the first to third embodiments, the case where the additive element (first element) is sulfur has been described as an example. However, if the additive element is at least one element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W), a deep level can be formed in the silicon carbide layer 10, so that the same effects as sulfur (S) can be obtained.

Further, in the second embodiment, the case where the termination element (second element) is nitrogen has been described as an example. However, if the termination element is at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu), dangling bonds on the surface of the silicon carbide layer 10 are reduced, so that the same effects as nitrogen (N) can be obtained.

Further, in the fourth to seventh embodiments, the case where the semiconductor device according to the present disclosure is applied to the vehicle or the elevator has been described as an example. However, the semiconductor device according to the present disclosure can be applied to a power conditioner of a photovoltaic power generation system and the like, for example.

Further, in the fourth to seventh embodiments, the case where the semiconductor device according to the first embodiment is applied has been described as an example. However, the semiconductor device according to the second embodiment or the third embodiment can be applied.

While certain embodiments have been described, these embodiments have been presented by way of example only, and are not intended to limit the scope of the inventions. Indeed, a semiconductor device, an inverter circuit, a drive device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a gate electrode;
a gate insulating layer; and
a silicon carbide layer, wherein
the gate insulating layer is located between the gate electrode and the silicon carbide layer,
the silicon carbide layer includes at least one first element selected from a group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W),
a first distance between a first position in the silicon carbide layer and an interface between the gate insulating layer and the silicon carbide layer is equal to or less than 20 nm, and the first position is a position where a concentration of the at least one first element is maximized, and
a second distance between a second position in the silicon carbide layer and the interface is equal to or less than 20 nm, the second position is a position where the concentration of the at least one first element is 1/10 of the concentration of the at least one first element at the first position, and the second position is farther from the interface than the first position,
wherein the concentration of the at least one first element at the first position is equal to or more than $1 \times 10^{17}$ cm$^{-3}$ and equal to or less than $5 \times 10^{21}$ cm$^{-3}$.

2. The semiconductor device according to claim 1, wherein the concentration of the at least one first element at the first position is equal to or more than $1 \times 10^{17}$ cm$^{-3}$.

3. The semiconductor device according to claim 1, wherein the concentration of the at least one first element at the first position is equal to or more than $3 \times 10^{18}$ cm$^{-3}$.

4. The semiconductor device according to claim 1, wherein the concentration of the at least one first element at the first position is equal to or less than $5 \times 10^{21}$ cm$^{-3}$.

5. The semiconductor device according to claim 1, wherein the concentration of the at least one first element at the first position is equal to or less than $1 \times 10^{20}$ cm$^{-3}$.

6. The semiconductor device according to claim 1, wherein atoms of the at least one first element exist at positions of carbon atoms in a crystal structure of silicon carbide.

7. The semiconductor device according to claim 6, wherein a density of the atoms of the at least one first element existing at the positions of the carbon atoms in the crystal structure of silicon carbide is larger than a density of the atoms of the at least one first element existing at positions of silicon atoms in the crystal structure of silicon carbide.

8. The semiconductor device according to claim 1, wherein the first distance is equal to or less than 5 nm.

9. The semiconductor device according to claim 1, wherein the silicon carbide layer includes aluminum, and the concentration of the at least one first element at the first position is higher than an aluminum concentration at the first position.

10. The semiconductor device according to claim 9, wherein the aluminum concentration at the first position is equal to or more than $1\times10^{15}$ cm$^{-3}$.

11. A semiconductor device, comprising:
   a gate electrode;
   a gate insulating layer; and
   a silicon carbide layer, wherein
   the gate insulating layer is located between the gate electrode and the silicon carbide layer,
   the silicon carbide layer includes at least one first element selected from a group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W),
   a first distance between a first position in the silicon carbide layer and an interface between the gate insulating layer and the silicon carbide layer is equal to or less than 20 nm, and the first position is a position where a concentration of the at least one first element is maximized,
   a second distance between a second position in the silicon carbide layer and the interface is equal to or less than 20 nm, the second position is a position where the concentration of the at least one first element is 1/10 of the concentration of the at least one first element at the first position, and the second position is farther from the interface than the first position, and
   wherein each of the silicon carbide layer and the gate insulating layer includes at least one second element selected from a group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

12. The semiconductor device of claim 11, wherein a distance from a third position where a concentration of the second element is maximized to the interface is equal to or less than 5 nm.

13. An inverter circuit comprising the semiconductor device according to claim 1.

14. A drive device comprising the semiconductor device according to claim 1.

15. A vehicle comprising the semiconductor device according to claim 1.

16. An elevator comprising the semiconductor device according to claim 1.

* * * * *